(12) United States Patent
Nakamura et al.

(10) Patent No.: US 11,880,528 B2
(45) Date of Patent: Jan. 23, 2024

(54) STIMULUS TRANSMISSION DEVICE

(71) Applicant: Murata Manufacturing Co., Ltd., Nagaokakyo (JP)

(72) Inventors: Norio Nakamura, Tsukuba (JP); Koji Osaki, Tsukuba (JP); Shuichi Hirai, Tsukuba (JP); Natsuo Koda, Tsukuba (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/157,422

(22) Filed: Jan. 20, 2023

(65) Prior Publication Data

US 2023/0152921 A1    May 18, 2023

Related U.S. Application Data

(63) Continuation of application No. 16/616,927, filed as application No. PCT/JP2018/020053 on May 24, 2018, now Pat. No. 11,609,655.

(30) Foreign Application Priority Data

May 24, 2017    (JP) ................................ 2017-103156

(51) Int. Cl.
```
G06F 3/041     (2006.01)
G06F 3/01      (2006.01)
H03K 17/96     (2006.01)
```
(52) U.S. Cl.
CPC .......... *G06F 3/04164* (2019.05); *G06F 3/011* (2013.01); *G06F 3/0414* (2013.01); *H03K 17/96* (2013.01)

(58) Field of Classification Search
CPC .... G06F 3/04164; G06F 3/011; G06F 3/0414; G06F 3/016; G06F 3/02; G06F 3/0346; H03K 17/96; H03K 2217/96062
See application file for complete search history.

(56) References Cited

U.S. PATENT DOCUMENTS

| | | | |
|---|---|---|---|
| 3,848,216 A | 11/1974 | Gamble | |
| 4,458,238 A * | 7/1984 | Learn | .................... G06F 3/0238 |
| | | | 345/169 |

(Continued)

FOREIGN PATENT DOCUMENTS

| | | |
|---|---|---|
| JP | 2000-137576 A | 5/2000 |
| JP | 2002-149111 A | 5/2002 |

(Continued)

OTHER PUBLICATIONS

International Search Report received in PCT Application No. PCT/JP2018/020053, dated Jul. 3, 2018 in 5 pages.

(Continued)

*Primary Examiner* — Benyam Ketema
(74) *Attorney, Agent, or Firm* — Knobbe, Martens, Olson & Bear LLP

(57) ABSTRACT

A stimulus transmission device suppresses power consumption, and effectively transmits a physical stimulus to a user. The stimulus transmission device has a pressure receiving portion which receives pressure from part of a human body, an actuator which drives the pressure receiving portion, and a supporting portion which supports the actuator. The actuator does not move in conjunction with the supporting portion.

6 Claims, 38 Drawing Sheets

(56) References Cited

U.S. PATENT DOCUMENTS

| | | | |
|---|---|---|---|
| 4,489,303 A | 12/1984 | Martin | |
| 5,057,657 A | 10/1991 | Skulic | |
| 5,646,587 A | 7/1997 | Miyazawa et al. | |
| 5,883,346 A | 3/1999 | Stöcken | |
| 5,929,846 A * | 7/1999 | Rosenberg | G06F 3/038 |
| | | | 345/161 |
| 6,088,017 A * | 7/2000 | Tremblay | G06F 3/0484 |
| | | | 345/156 |
| 6,429,849 B1 * | 8/2002 | An | G05G 25/04 |
| | | | 345/161 |
| 6,468,158 B1 * | 10/2002 | Ootori | G05G 9/04785 |
| | | | 463/37 |
| 6,480,752 B1 | 11/2002 | Blume et al. | |
| 6,667,579 B2 | 12/2003 | Kanazawa et al. | |
| 6,708,887 B1 * | 3/2004 | Garrett | G06K 7/10881 |
| | | | 235/472.01 |
| 7,098,895 B2 | 8/2006 | Ono et al. | |
| 7,176,892 B2 | 2/2007 | Kobayashi | |
| 7,312,791 B2 * | 12/2007 | Hoshino | G06F 3/016 |
| | | | 345/173 |
| 7,336,260 B2 | 2/2008 | Martin et al. | |
| 7,450,110 B2 | 11/2008 | Shahoian et al. | |
| 7,683,748 B2 | 3/2010 | Ruettiger | |
| 7,728,819 B2 | 6/2010 | Inokawa | |
| 7,741,979 B2 * | 6/2010 | Schlosser | G06F 3/016 |
| | | | 341/27 |
| 7,764,268 B2 * | 7/2010 | Gomez | G06F 3/016 |
| | | | 345/157 |
| 8,803,802 B2 | 8/2014 | Hatanaka et al. | |
| 9,343,248 B2 * | 5/2016 | Casparian | H03K 17/965 |
| 9,417,718 B2 | 8/2016 | Ishikawa et al. | |
| 10,324,502 B2 | 6/2019 | Yazaki | |
| 10,635,171 B2 | 4/2020 | Nakamura et al. | |
| 11,429,187 B2 * | 8/2022 | Ishikawa | G06F 3/0216 |
| 2002/0054060 A1 | 5/2002 | Schena | |
| 2002/0149561 A1 * | 10/2002 | Fukumoto | G06F 3/04886 |
| | | | 345/156 |
| 2004/0059245 A1 | 3/2004 | Watanabe et al. | |
| 2004/0252104 A1 * | 12/2004 | Nakamura | G06F 3/011 |
| | | | 345/160 |
| 2005/0179644 A1 * | 8/2005 | Alsio | G06F 3/0237 |
| | | | 345/157 |
| 2007/0139375 A1 | 6/2007 | Rosenberg et al. | |
| 2007/0152974 A1 | 7/2007 | Kim et al. | |
| 2008/0227547 A1 | 9/2008 | Nourry | |
| 2010/0149111 A1 * | 6/2010 | Olien | G06F 3/041 |
| | | | 345/173 |
| 2010/0194692 A1 * | 8/2010 | Orr | G06F 3/04182 |
| | | | 345/173 |
| 2011/0140818 A1 | 6/2011 | Hatanaka et al. | |
| 2015/0153829 A1 | 6/2015 | Shiraishi | |
| 2016/0342208 A1 | 11/2016 | Levesque et al. | |
| 2017/0220111 A1 | 8/2017 | Nakamura et al. | |
| 2017/0221323 A1 | 8/2017 | Nakamura et al. | |
| 2017/0235364 A1 * | 8/2017 | Nakamura | G06F 3/016 |
| | | | 345/156 |
| 2018/0203509 A1 * | 7/2018 | Yamano | A63F 13/218 |
| 2019/0339804 A1 | 11/2019 | Gleeson et al. | |
| 2020/0249814 A1 | 8/2020 | Nakamura et al. | |

FOREIGN PATENT DOCUMENTS

| | | | | |
|---|---|---|---|---|
| JP | 2002-149312 A | 5/2002 | | |
| JP | 2003-525490 A | 8/2003 | | |
| JP | 2012-084014 A | 4/2012 | | |
| JP | 2012-511780 A | 5/2012 | | |
| JP | 2015-230620 A | 12/2015 | | |
| JP | 2016-219002 A | 12/2016 | | |
| JP | 2017-073100 A | 4/2017 | | |
| JP | 2017-073101 A | 4/2017 | | |
| WO | WO 2013/183191 A | 12/2013 | | |
| WO | WO 2016/038953 A | 3/2016 | | |
| WO | WO 2017/082386 A | 5/2017 | | |
| WO | WO-2017082386 A1 * | 5/2017 | | G06F 3/01 |

OTHER PUBLICATIONS

Notice of Reasons for Refusal, dated May 19, 2021, in Japanese Patent Application No. JP 2019- 520315, in 8 pages.

Office Action, dated Aug. 25, 2022, issued by the Japan Patent Office to the counterpart application in Japan, JP 2021-136307, in 4 pages [with translation 11 pages for a total of 15 pages].

* cited by examiner

STIMULUS TRANSMISSION DEVICE

PRIORITY AND CROSS REFERENCE TO RELATED APPLICATIONS

This application is a Continuation Application of U.S. application Ser. No. 16/616,927, filed Nov. 25, 2019, which is the U.S. National Stage Application under 35 U.S.C. § 371 of International Application No. PCT/JP2018/020053, filed May 24, 2018, designating the U.S. and published as WO 2018/216780 A1 on Nov. 29, 2018, which claims the benefit of Japanese Patent Application No. JP 2017-103156, filed May 24, 2017. Any and all applications for which a foreign or a domestic priority is claimed is/are identified in the Application Data Sheet and is/are hereby incorporated by reference in their entirety.

TECHNICAL FIELD

The present invention relates to a stimulus transmission device which uses sensory characteristics. An example of the stimulus transmission device is also referred to as a haptic information presentation system.

BACKGROUND ART

For example, each of Patent Publication JP-A-2017-73100 and Patent Publication JP-A-2017-73101 describes a haptic information presentation system.

CITATION LIST

Patent Document

Patent Document 1: Patent Publication JP-A-2017-73100
Patent Document 2: Patent Publication JP-A-2017-73101

SUMMARY

In a stimulus transmission device such as the conventional haptic information presentation system, a physical stimulus such as vibration is transmitted to a user through an entire housing. Consequently, in the case where, e.g., a vibration stimulus is transmitted to the user, it follows that the entire housing vibrates. The housing contains, e.g., a relatively heavy battery (cell), and hence a problem arises in that high power consumption is required in order to vibrate the entire housing to transmit the vibration stimulus to the user. In addition, there are cases where the vibration stimulus is given to the user in a stick or a button of a controller which has a portion to which pressure is applied by the user. In these cases, when a physical stimulus is transmitted through the stick or the button, a high load is sometimes applied to an actuator for generating the physical stimulus, and a problem arises in that power consumption is increased.

To cope with this, an object of the present invention is to provide a stimulus transmission device in which power consumption is suppressed. In addition, an object of the present invention is to provide a stimulus transmission device capable of effectively transmitting a physical stimulus to a user.

The present invention is basically based on knowledge that, in a device having a portion to which pressure is applied by an input from a user, it is possible to suppress power consumption and effectively transmit a physical stimulus to the user by preventing an actuator which displaces a portion for transmitting pressure to the user from being integrated with a portion for supporting the actuator, and allowing the actuator (and a transmission portion which moves in conjunction with the actuator) to be displaced without moving in conjunction with a housing (device body).

The device of the present invention relates to a stimulus transmission device.

The stimulus transmission device has a pressure receiving portion 5, an actuator 7, and a supporting portion 9. The stimulus transmission device may have a drive control part for driving the actuator, and a device body (housing) which contains the actuator and the supporting portion.

The pressure receiving portion 5 is an element which comes into contact with a contact part which is part of a human body, and receives pressure from the contact part. Note that a physical stimulus is caused in a user by transmitting movement of the pressure receiving portion 5 to the user. With this, it is possible to provide, e.g., haptic information (tactile information) to the user.

The actuator 7 is an element for driving the pressure receiving portion 5.

The supporting portion 9 is an element which is not displaced integrally with the actuator 7 (does not move in conjunction with the actuator 7) even when the actuator 7 is displaced, and supports the actuator 7 in a state in which the actuator 7 is movable. The supporting portion 9 is usually integrated with the device body (housing). The actuator 7 does not move in conjunction with the supporting portion 9, and hence it is possible to efficiently transmit vibration of the actuator 7 to the user via the pressure receiving portion 5.

In the stimulus transmission device, the pressure receiving portion 5 may perform the same displacement in response to applied force in a tangential direction in a movable portion of the pressure receiving portion 5. That is, even in the case where the pressure receiving portion 5 moves with respect to the device (particularly in the case where the pressure receiving portion 5 is displaced so as to pivot in an arc about a certain point), when the same force is applied in the tangential direction at a point of application of the force, an angle and a magnitude (displacement) of displacement with respect to the direction of a perpendicular from the point of application of the force are not changed. Note that the displacement may not be the same displacement.

In the stimulus transmission device, the actuator 7 may perform any of or two or more of a movement in a front and rear direction, a movement in a left and right direction, a revolution movement, a rotation movement, and a movement in an up and down direction with respect to the supporting portion 9.

The stimulus transmission device may have a shaft part having a gimbal structure which is provided below the actuator 7, and a bearing which is provided in the supporting portion 9, and receives the shaft part having the gimbal structure.

The stimulus transmission device may have an elastic member which is provided below or horizontally to the actuator, and connects the supporting portion and the actuator.

The stimulus transmission device may have a support shaft which is provided below the actuator, supports the actuator, and has a lower part in contact with a bearing present in the supporting portion, and the lower part of the support shaft may have a curved surface portion in a portion in contact with the bearing.

In the stimulus transmission device, the pressure receiving portion 5 may be present in a portion which is not a portion of an input device.

In the stimulus transmission device, the pressure receiving portion 5 may be present not in a portion of an input device but in a portion other than a portion where pressure is maximized in a state in which a user holds the stimulus transmission device without manipulating the stimulus transmission device.

In the stimulus transmission device, the pressure receiving portion 5 may be present not in a portion of an input device but in a portion where pressure is maximized in a state in which a user holds the stimulus transmission device without manipulating the stimulus transmission device.

In the stimulus transmission device, the pressure receiving portion 5 may be present in an input device.

In the stimulus transmission device, the pressure receiving portion 5 and the actuator 7 may move integrally with each other, and an angle of the pressure receiving portion 5 with respect to the supporting portion 9 may change.

In the stimulus transmission device, the pressure receiving portion 5 and the actuator 7 may move integrally with each other, and the pressure receiving portion 5 may move while being maintained parallel to the supporting portion 9.

A stimulus transmission device may have at least two or more coupling means 11a and 11b which connect the pressure receiving portion 5 or the actuator 7, and the supporting portion 9.

The stimulus transmission device may have a ball bearing which connects the pressure receiving portion 5 or the actuator 7, and the supporting portion 9.

The stimulus transmission device may have a movement control rod 13 which is provided in a portion of the actuator 7 which faces the supporting portion 9, and a movement control frame 15 which is provided in the supporting portion 9, and controls movement of the movement control rod 13.

An example of the stimulus transmission device is a haptic information presentation system.

The present invention can provide the stimulus transmission device in which power consumption is suppressed. In addition, the present invention can provide the stimulus transmission device capable of effectively transmitting the physical stimulus to the user.

DETAILED DESCRIPTION

Hereinafter, embodiments of the present invention will be described by using the drawings. The present invention is not limited to the embodiments described below, and includes those appropriately modified from the following embodiments by those skilled in the art within the obvious scope.

Figure 16:
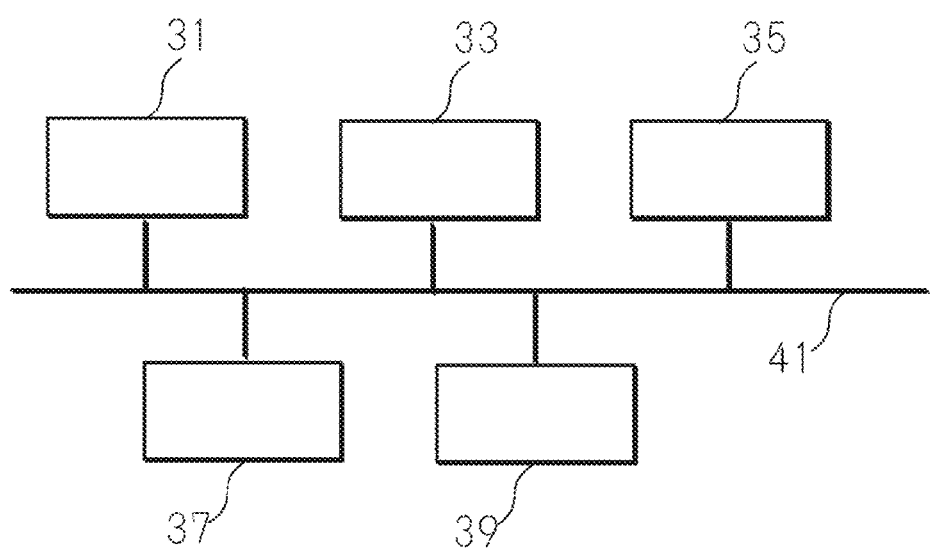
FIG. 16 is a block diagram showing the basic configuration of a computer.

A device of the present invention relates to a stimulus transmission device. The stimulus transmission device relates to a device capable of transmitting a physical stimulus such as displacement or vibration to a user. An example of the stimulus transmission device is a haptic information presentation system. In the device of the present invention, for example, an actuator is driven and controlled by a control device such as a computer. FIG. 16 is a block diagram showing the basic configuration of a computer. As shown in the drawing, the computer has an input part 31, an output part 33, a control part 35, an operation part 37, and a storage part 39, and the individual elements are connected to each other by a bus 41 and the like to be capable of exchanging information. For example, in the storage part, a control program may be stored or various pieces of information may also be stored. In the case where predetermined information is input from the input part, the control part reads the control program stored in the storage part. Subsequently, the control part reads information stored in the storage part appropriately, and transmits the information to the operation part. In addition, the control part transmits input information to the operation part appropriately. The operation part performs arithmetic processing by using received various pieces of information, and stores the arithmetic processing in the storage part. The control part reads the result of the arithmetic processing stored in the storage part, and outputs the result of the arithmetic processing from the output part. In this manner, various processes are executed. Note that, in the above computer, a terminal or a server may be in charge of part of functions.

Figure 17:
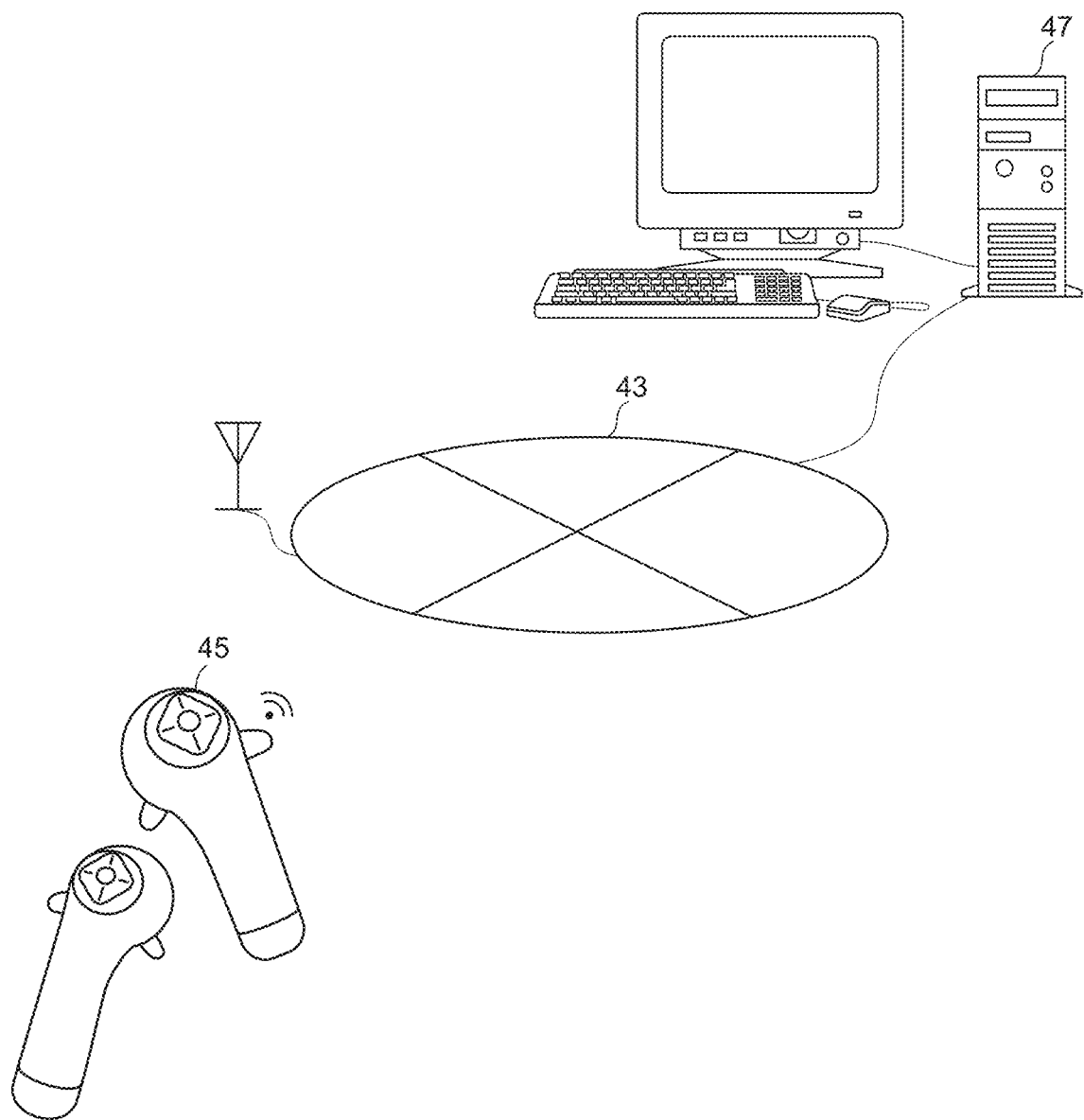
FIG. 17 is a conceptual view showing an example of a system including the stimulus transmission device of the present invention.

FIG. 17 is a conceptual view showing an example of a system including the stimulus transmission device of the present invention. As shown in FIG. 17, the system including the stimulus transmission device of the present invention may have communication function, and may include a stimulus transmission device 45 in which peripheral equipment and the stimulus transmission device are connected therebetween and which is connected to the Internet or an intranet 43, and a server 47 connected to the Internet or the intranet 43. It goes without saying that a single computer, a mobile terminal, or a controller (a controller capable of exchanging information with a gaming console) may function as the device of the present invention, or a plurality of servers may also be present.

Figure 20:
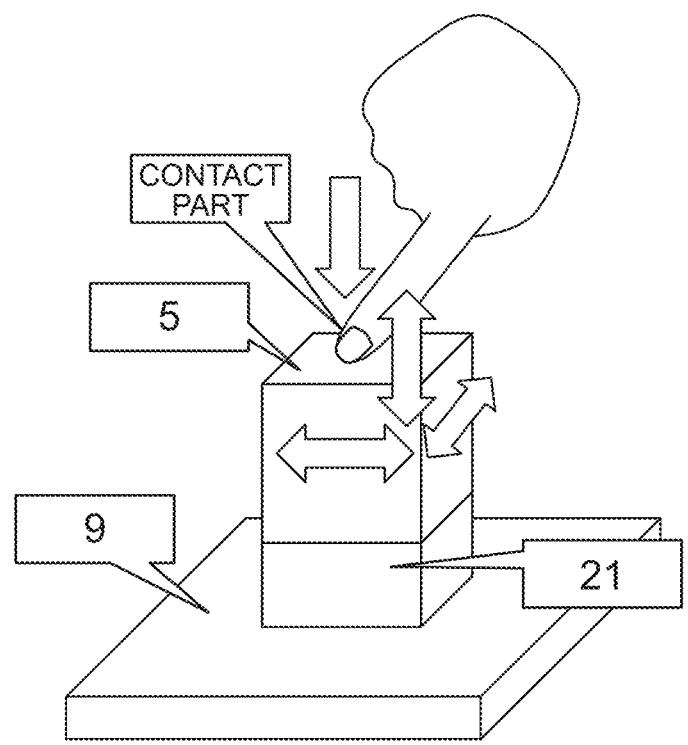
FIG. 20 is a view for explaining a conceptual example of the stimulus transmission device of the present invention.

FIG. 20 is a view for explaining a conceptual example of the stimulus transmission device of the present invention. FIG. 20 relates to a type called a pedestal type. In this example, with regard to the pressure receiving portion 5, an actuator and a pressure receiving portion are caused to vibrate in directions of a maximum of six degrees of freedom (parallel to green arrows, rotation) by the actuator which is not shown. The pressure receiving portion 5 has a contact part with which a finger of a user comes into contact. A coupling member 21 formed of an elastic member or a low friction member is provided between the contact part and a supporting portion 9 which is part of a housing (or a portion integrated with the housing). With this, even when the supporting portion 9 moves, the actuator does not perform the same movement as that of the supporting portion 9 in response to the movement of the supporting portion 9. That is, the coupling member 21 functions as a cushioning material portion of operation. The coupling member 21 is depressed when it receives pressure, and hence a shock on a hand is reduced and the hand is prevented from being hurt. In addition, the pressure receiving portion fits the hand sensuously and it becomes easier to transmit vibration to a person via the pressure receiving part. Further, since the coupling member 21 is present, when the actuator is driven, it is possible to reduce vibration which is not related to a haptics effect and, moreover, reduce vibration noise when the actuator is driven. Furthermore, it becomes possible to dissipate heat from the actuator. The actuator is a device which generates a physical quantity such as vibration based on an input control waveform. Examples of the actuator include a motor, a linear actuator, a vibrator, a voice coil, a speaker, a piezoelectric element, a solenoid coil, a macromolecular polymer, an artificial muscle, a gyroscope, an aerodynamic device, an ultrasonic array, a hydraulic power unit, a magnetic fluid, a steam engine, a bimetal, and a bio-motor.

Figure 21:
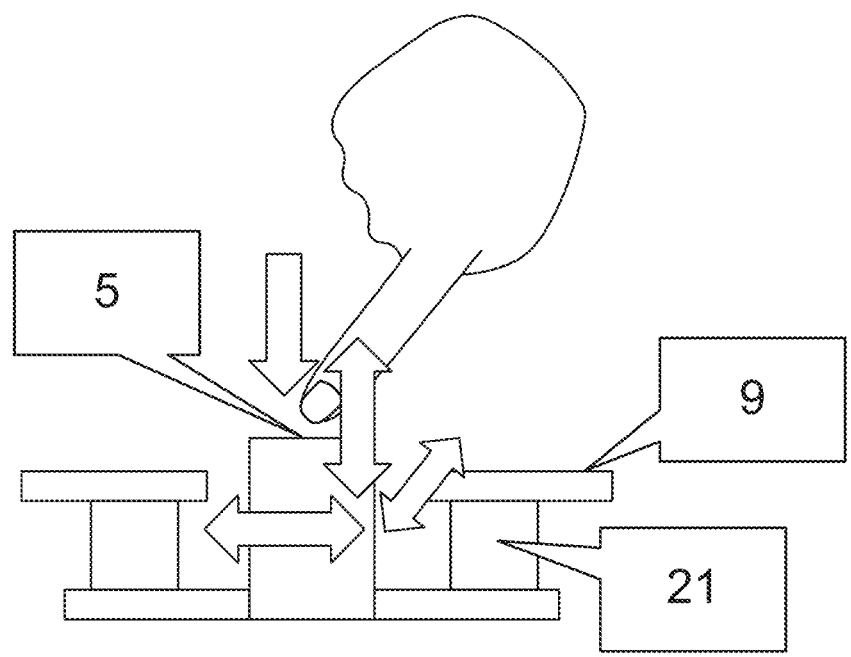
FIG. 21 is a view for explaining a conceptual example of the stimulus transmission device of the present invention.

FIG. 21 is a view for explaining a conceptual example of the stimulus transmission device of the present invention. FIG. 21 relates to a type called a suspension type. In this example, the actuator and the pressure receiving portion 5 are connected from the supporting portion 9 which is part of the housing via the coupling member 21 formed of the elastic member or the low friction member. Accordingly, the pressure receiving portion 5 is suspended from the supporting portion which is part of the housing.

Figure 22:
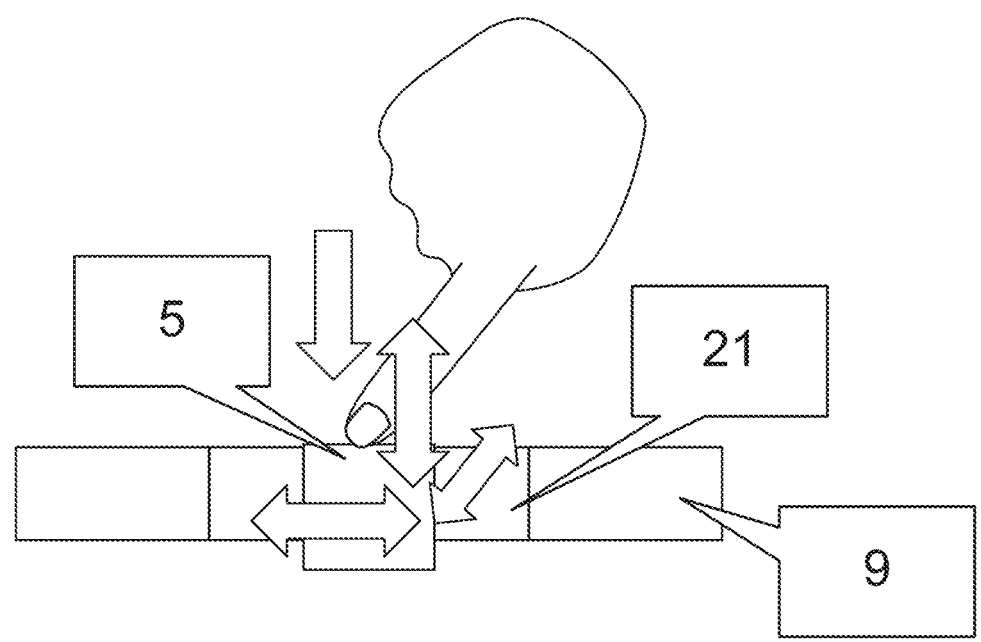
FIG. 22 is a view for explaining a conceptual example of the stimulus transmission device of the present invention.

FIG. 22 is a view for explaining a conceptual example of the stimulus transmission device of the present invention. FIG. 22 relates to a type called a sandwich type. In the device of this type, the pressure receiving portion 5 is present between the supporting portions 9 which are part of the housing, and the coupling member 21 is present so as to connect the pressure receiving portion 5 and the supporting portion 9. An example of the coupling member includes a gel serving as an elastic member and the like.

Figure 23:
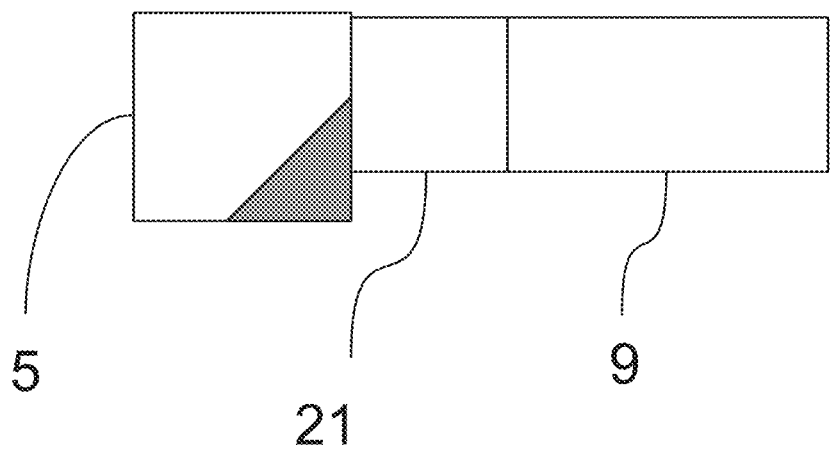
FIG. 23 is a view for explaining a conceptual example of the stimulus transmission device of the present invention.

FIG. 23 is a view for explaining a conceptual example of the stimulus transmission device of the present invention. FIG. 23 shows a type called a type in which the elastic member is sandwiched between the pressure receiving portion and the supporting portion. FIG. 23 relates to the type called the sandwich type. In the device of this type, an elastic member 21 is present so as to connect the pressure receiving portion 5 and the supporting portion 9. An example of the coupling member includes the gel serving as the elastic member and the like.

Figure 25:
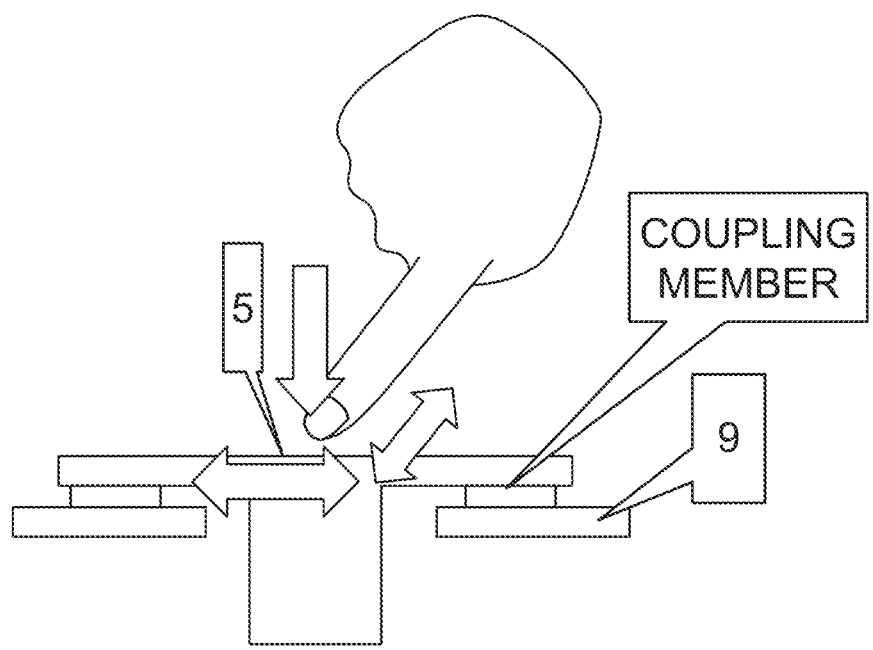
FIG. 25 is a conceptual view showing an example of the stimulus transmission device in which the pressure receiving portion is present so as to cover an opening portion of the housing and a coupling portion is present between part of the pressure receiving portion and a housing portion (support body portion) present in an area below the part of the pressure receiving portion.

FIG. 25 is a conceptual view showing an example of the stimulus transmission device in which the pressure receiving portion is present so as to cover an opening portion of the housing, and a coupling portion is present between part of the pressure receiving portion and a housing portion (support body portion) which is present in an area below the part of the pressure receiving portion. In this mode, the low friction member may be used as the coupling portion. Also in this example, similarly to other examples, the pressure receiving portion and the supporting portion are not directly connected to each other, and the pressure receiving portion is floated. This example has an advantage that, even when pressure is applied to the pressure receiving portion, the pressure receiving portion is not depressed unnecessarily, and it is possible to smoothly transmit drive of the actuator to the pressure receiving portion.

Figure 26:
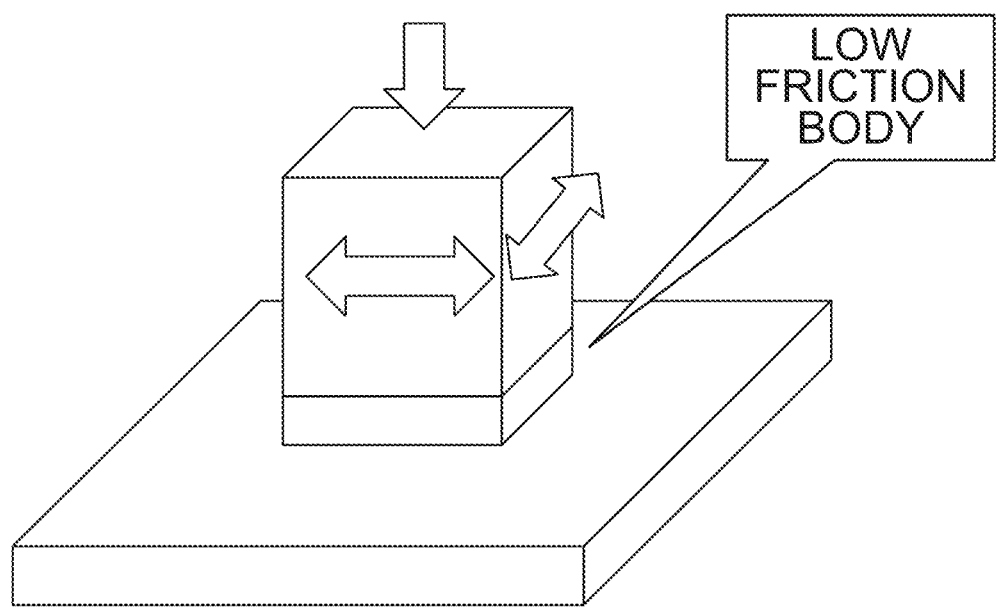
FIG. 26 is a conceptual view showing an example of the stimulus transmission device which uses a low friction body.

FIG. 26 is a conceptual view showing an example of the stimulus transmission device which uses a low friction body as the coupling member. In this example, it is possible to reduce friction between the pressure receiving portion and the support body portion, and hence the pressure receiving portion can move smoothly.

Figure 1:
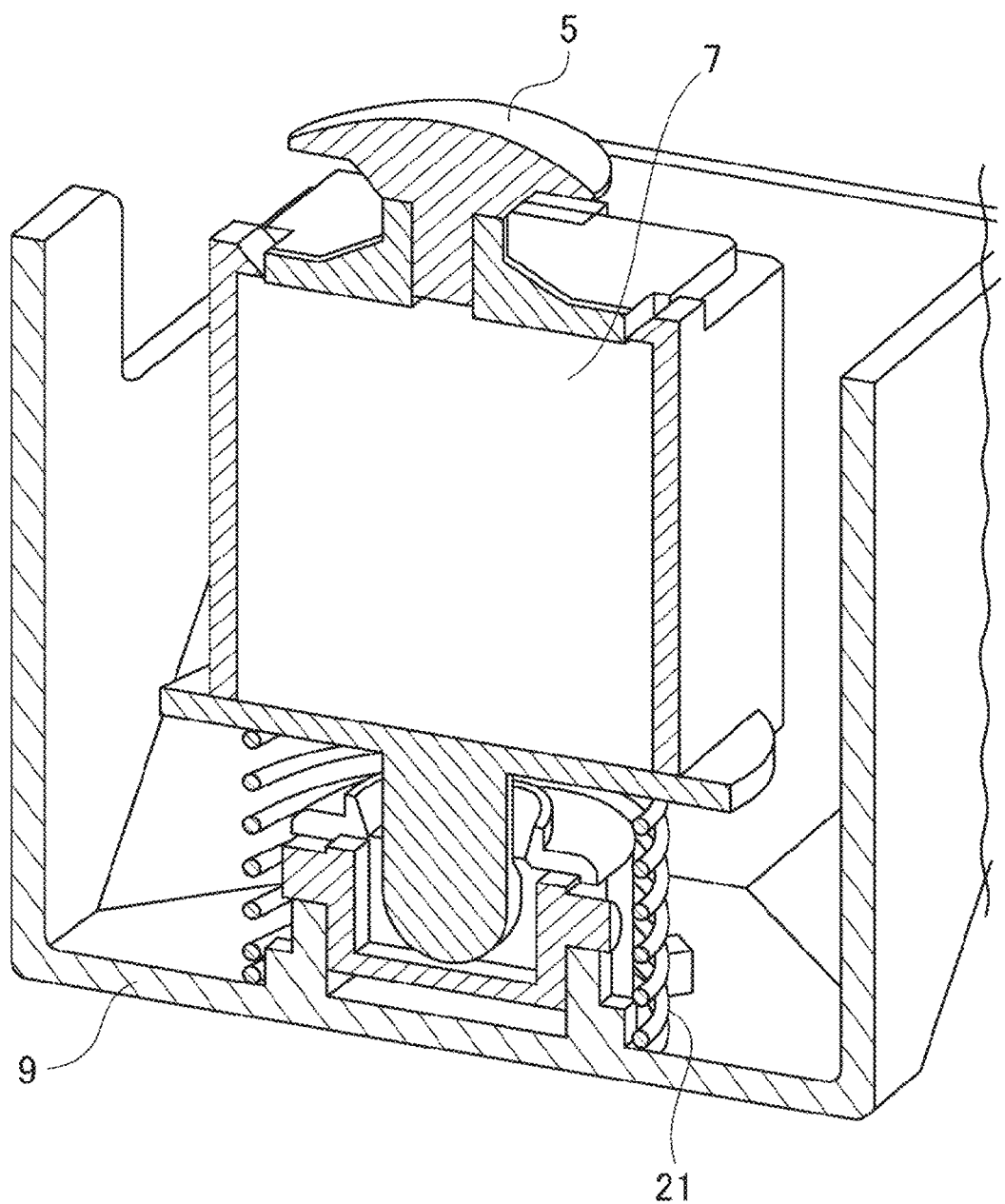
FIG. 1 is a conceptual view (cross-sectional view) showing an example of a stimulus transmission device.

FIG. 1 is a conceptual view (cross-sectional view) showing an example of the stimulus transmission device. As shown in FIG. 1, the stimulus transmission device has the pressure receiving portion 5, an actuator 7, and the supporting portion 9. The stimulus transmission device may have a drive control part for driving the actuator, and a device body (housing) which contains the actuator and the supporting portion. In addition, the stimulus transmission device may appropriately include a game controller, a mobile terminal, and other elements provided in a haptic information presentation system. An example of the specific element is a sensor. The sensor detects various pieces of information of the user, and inputs the detected pieces of information into the device. The input various pieces of information are stored in, e.g., a storage part, and can be used for various drives of the actuator. Examples of the stimulus transmission device include a mobile terminal, a holding portion of a game machine (a handle, a fishing reel, a gun, a sword, a shield, a stick, a ring, a talisman, an ornament, or a wand), a game controller, a monitor (display device) for a game, a touch panel, and a vehicle-mounted device (a car navigation system, a steering wheel, or an operation system).

In FIG. 1, the actuator 7 and the supporting portion 9 do not move in conjunction with each other. "The actuator 7 and the supporting portion 9 do not move in conjunction with each other" means that, even when the supporting portion 9 moves, the actuator 7 does not perform the same movement as that of the supporting portion 9 in response to the movement of the supporting portion 9. In FIG. 1, a spring for center return is present. In addition, a pivot is present in the lower part of a container of the actuator, and the stimulus transmission device is displaced by using a pivotal center as the center position of the movement. On the other hand, the supporting portion 9 supports the actuator 7 in a state in which the actuator 7 is movable. In the example in FIG. 1, the elastic member 21 is present between the supporting portion 9 and the actuator 7. As a result, the supporting portion 9 supports the actuator 7 in the state in which the actuator 7 is movable via the elastic member 21. The actuator 7 drives the pressure receiving portion 5. The pressure receiving portion 5 is pressed by, e.g., a finger of the user. Correspondingly, the actuator 7 drives the pressure receiving portion 5, whereby the user receives pressure via the finger.

The physical quantity may be received from the pressure receiving portion instead of pressure. Examples of the physical quantity include displacement, speed, acceleration, force, vibration, torque, pressure, shearing force, stress, distortion, and change amounts thereof. That is, the stimulus transmission device can transmit the change of each of the above physical quantities to the user in the form of pressure.

The stimulus transmission device may have an AI/ML (artificial intelligence/machine learning) part, though not shown in the drawing. That is, this device may have one or both of the artificial intelligence part and the machine learning part. The AI/ML part calculates further optimized various pieces of information based on, e.g., various pieces of information input via a sensor, various pieces of information input to the actuator, and various pieces of information pre-stored in the AI/ML part, and stores the calculated pieces of information in the storage part. Thus, by having one or both of the artificial intelligence part and the machine learning part, it becomes possible to perform the drive of the actuator and the like in the individual devices more effectively and more optimally according to the state, behavior, and characteristic of the user. Examples of the various pieces of information include information related to five senses such as temperature, humidity, illumination, brightness, color, sound, smell, taste, an image, a picture, vibration, feeling, and touch, biometrics information such as brain waves and a pulse, physical quantity information such as a position, speed, acceleration, gravity, an attitude, angular velocity, angular acceleration, a rotation position, rotational speed, rotational acceleration, azimuth, movement, action, manipulation, contact, infrared rays, ultraviolet rays, radio wave, gravity, magnetic force, myoelectric potential, distance, electricity, current, static electricity, pressure, delay, aberration, and distortion, personal information such as age, sex, body information, academic ability, a name, an address, a phone number, preference, nationality, race, religion, and DNA, a use situation, a use history, a use frequency, an adaptability level, and a learning level.

The sensor may be able to detect not only various pieces of information of the user but also various pieces of information of an environment in which the device is placed. The sensor may be able to detect various pieces of information of the actuator and information obtained by measuring an operation situation, and input the detected information into the device. The sensor may cause an operation part to perform an operation for correcting drive information of the actuator by using the various pieces of information of the actuator and the information obtained by measuring the operation situation, and drive the actuator by using a drive signal after the correction. In addition, a plurality of pieces of information obtained from the various pieces of sensor information mentioned above may be processed, combined, and used.

Examples of application of the sensor are as follows.
Correct the drive of the actuator and the like correspondingly to secular change of the actuator.
Fail-safe function such as disabling the operation of the device correspondingly to detection of failure of the actuator.
Correct the drive of the actuator and the like correspondingly to temperature change of the actuator.
Fail-safe function such as disabling the operation of the device correspondingly to temperature change of the actuator.
Correct the drive of the actuator and the like correspondingly to temperature change of the environment.
Fail-safe function such as disabling the operation of the device correspondingly to temperature change of the environment.
Detect G (acceleration or the like) applied to the device and correct the drive of the actuator and the like.

Detect differences among users and correct the drive of the actuator and the like.

Correct a delay in remote control.

The position of the sensor may be any of the inside of the device, the inside of the pressure receiving portion, and the inside of a stimulus transmission portion.

The stimulus transmission device may be stationery such as a mouse, a pen, a stylus pen, a brush, or an eraser, a bat, a fishing rod, a remote control, a key, a spray, an airbrush, navigation equipment, video equipment, movie equipment, rehabilitation equipment, sport gear, a stick, a golf club, a pallet, a chisel, glasses, headphones, healthcare equipment such as massage equipment, gloves, a glove, transport equipment such as a bicycle, an automobile, or an airplane, clothing, beauty care equipment, play equipment, a machine tool, VR equipment, AR equipment, XR equipment, learning equipment, office equipment, domestic electrical equipment, or medical equipment such as a surgical knife.

The pressure receiving portion 5 is an element which comes into contact with a contact part which is part of a human body and receives pressure from the contact part. Note that a physical stimulus is caused in the user by transmitting the movement of the pressure receiving portion 5 to the user. With this, for example, haptic information (tactile information) can be provided to the user. The pressure receiving portion 5 is preferably separated from the device body physically. However, the pressure receiving portion 5 may be physically coupled to the device body made of plastic or the like via rubber or elastic material. The pressure receiving portion 5 is preferably a portion which does not move integrally with the device body. The pressure receiving portion 5 may be any portion which can transmit the physical stimulus to the user. Consequently, the pressure receiving portion 5 may be present only at one position in one device, or the pressure receiving portions 5 may be present at two positions or at two or more positions in one device. In the case where the pressure receiving portions 5 are present at two or more positions, it is possible to give stimuli which are independent of each other to the user. Note that, in the case where the pressure receiving portion 5 is a monitor surface, it is preferable that, instead of the entire monitor, part of the monitor separated from the entire monitor constitutes the pressure receiving portion 5. With this, the necessity to drive the entire monitor is eliminated, and it is possible to suppress power consumption.

The pressure receiving portion 5 is preferably separated from the device body physically. However, with regard to the pressure receiving portion 5, the low friction body may be sandwiched between the pressure receiving portion which may be physically coupled to the device body made of plastic or the like via rubber or elastic material, and the device. The low friction body facilitates sliding of the pressure receiving portion.

Figure 24A:
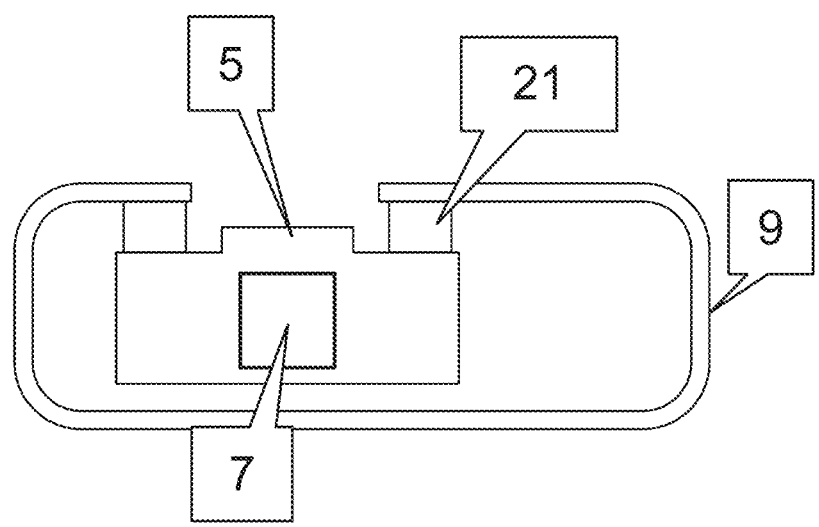
FIGS. 24(A-C) show a conceptual view showing a relationship between the pressure receiving portion and the housing.

FIGS. 24(A-C) show a relationship between the pressure receiving portion and the housing. As shown in FIG. 24(A), the pressure receiving portion is buried in the device body (housing), and the user may come into contact with the pressure receiving portion from the opening part of the housing.

Figure 24B:
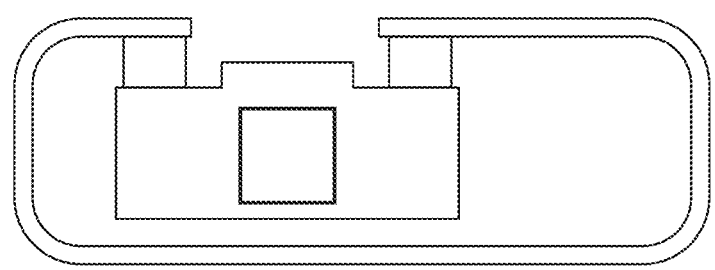
Figure 24C:
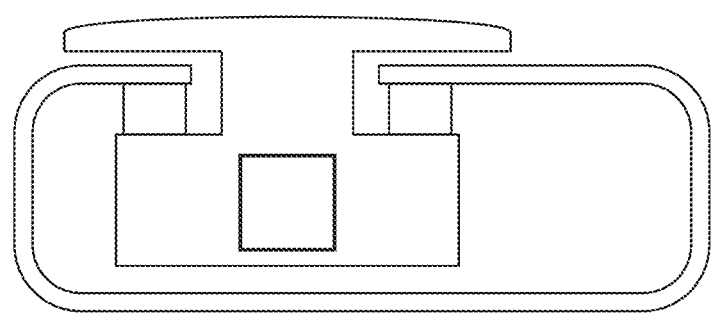

As shown in FIG. 24(B), the pressure receiving portion may be exposed on the surface of the device body (housing). As shown in FIG. 24(C), the pressure receiving portion may have a portion exposed on the surface of the device body, and may be installed so as to cover part of the device body. The pressure receiving portion in this mode can fit part of a body more tightly to transmit the stimulus more efficiently, and it becomes difficult for garbage and water to enter the device. In FIG. 24A, the pressure receiving part corresponds to the pressure receiving portion 5, the actuator corresponds to the actuator 7, and the supporting part corresponds to the supporting portion 9.

The pressure receiving portion 5 may be flat or curved. In the case where the pressure receiving portion 5 is curved, on the assumption that the pressure receiving portion or an opening is provided in an upper direction from the housing, the pressure receiving portion 5 may be shaped so as to be upwardly convex or downwardly convex. In addition, the surface of the pressure receiving portion may be subjected to surface treatment. The surface treatment may be, e.g., surface treatment in which the surface is made rough by blasting or may also be surface treatment in which roughness or a groove is formed by using a predetermined pattern. Since the pressure receiving portion is subjected to the surface treatment, it is possible to cause the pressure receiving portion to fit part of a body more tightly to transmit the stimulus more efficiently, and it is possible to increase friction with part of the body to transmit the physical quantity (pressure, a stimulus, or the like) more efficiently.

An example of recognition function of the pressure receiving portion 5 is as follows. In order to recognize that a portion of a body (e.g., a finger or the back of a hand) which is mounted on the pressure receiving portion is placed on the pressure receiving portion, a sensor such as a touch sensor, a pressure sensor, or an optical sensor may be installed in the pressure receiving portion.

Figure 27:
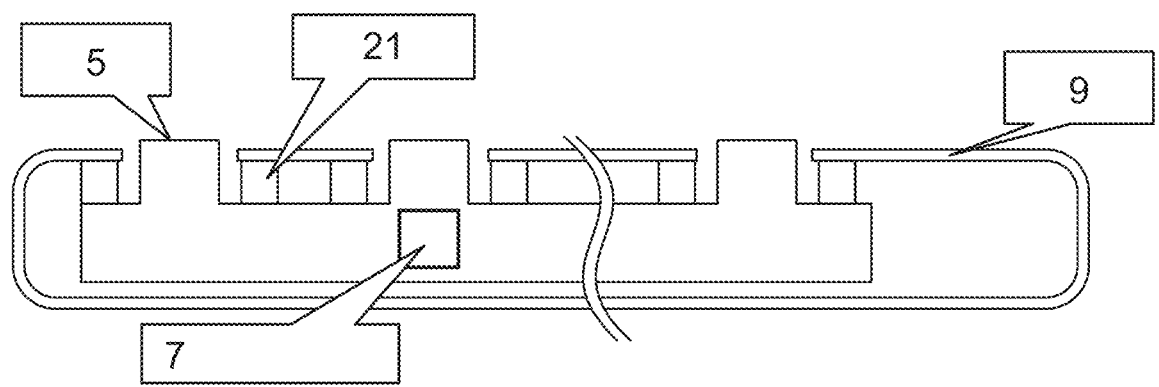
FIG. 27 is a conceptual view showing an example of the stimulus transmission device having a plurality of the pressure receiving portions.

Only one pressure receiving portion may be present in one stimulus transmission device, or a plurality of the pressure receiving portions may be present in one stimulus transmission device. FIG. 27 is a conceptual view showing an example of the stimulus transmission device having a plurality of the pressure receiving portions. In the stimulus transmission device, one actuator drives a plurality of the pressure receiving portions. Note that a plurality of the actuators may be present in one stimulus transmission device.

Figure 28:
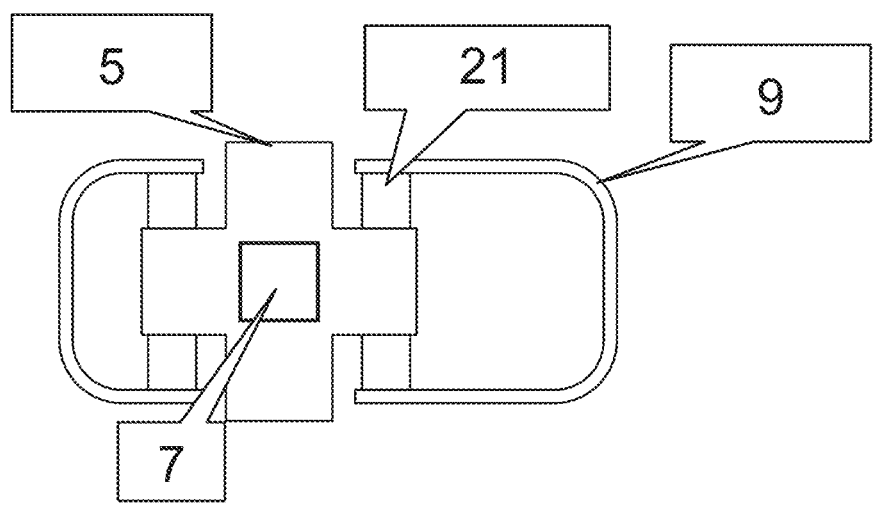
FIG. 28 is a conceptual view showing an example of the stimulus transmission device having a plurality of the pressure receiving portions.

FIG. 28 is a conceptual view showing an example of the stimulus transmission device having a plurality of the pressure receiving portions. In the example in FIG. 28, a plurality of the pressure receiving portions are connected to one actuator at different angles, and the pressure receiving portions are driven by one actuator at different angles.

Figure 29:
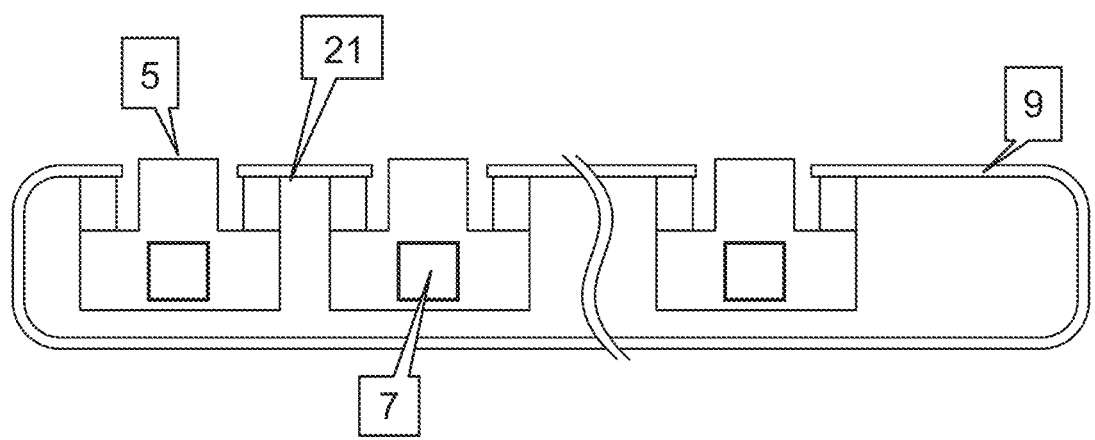
FIG. 29 is a conceptual view showing an example of the stimulus transmission device having a plurality of the actuators.

FIG. 29 is a conceptual view showing an example of the stimulus transmission device having a plurality of the actuators. In the example shown in FIG. 29, a plurality of the pressure receiving portions are present, and are driven by the actuators which are independent of each other. With this, it is possible to simultaneously provide different stimuli to the user. In addition, it is possible to change vibration according to the contact portion of the body of the user.

Figure 32:
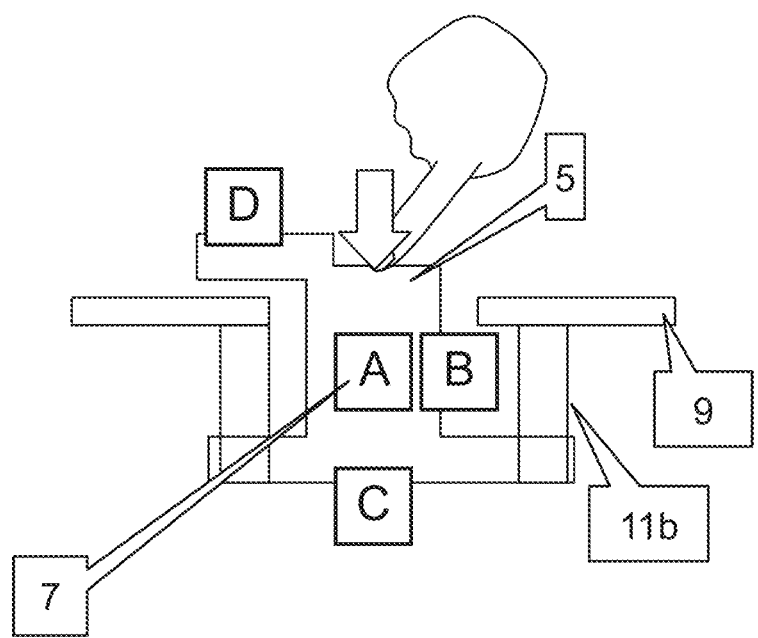
FIG. 32 is a conceptual view showing placement positions of the actuator.
Figure 33:
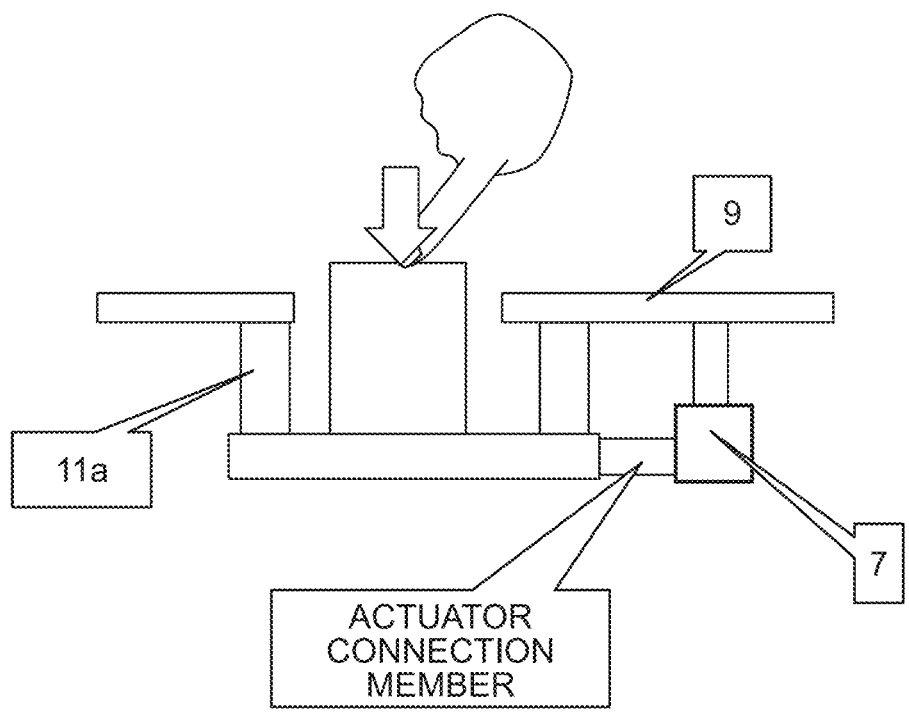
FIG. 33 is a conceptual view showing an example of the stimulus transmission device in which the actuator is connected to the pressure receiving portion by using an actuator connection member.

FIG. 32 is a conceptual view showing the placement positions of the actuator. As indicated by A, B, C, and D in FIG. 32, the actuator can be installed at various positions as long as the actuator can drive the pressure receiving portion. A indicates the actuator present immediately below the pressure receiving surface of the pressure receiving portion, B indicates the actuator present in a portion which is offset from the pressure receiving surface, C indicates the actuator present in a portion below the pressure receiving portion, and D indicates the actuator present in a portion above the pressure receiving portion. The actuator may be connected to the pressure receiving portion via an actuator connection member. A plurality of the actuators may be installed at a plurality of positions. FIG. 33 is a conceptual view showing an example of the stimulus transmission device in which the actuator is connected to the pressure receiving portion by using the actuator connection member.

In the stimulus transmission device, the pressure receiving portion 5 may be present in a portion which is not a portion of an input device. Examples of the input device include a stick and a button in a controller. For example, the stick or the button in the game controller is the input device which is used to input various pieces of manipulation information for playing a game to the device body. In the input device, pressure to be applied significantly fluctuates. Consequently, there are cases where pressure is applied to the actuator in the stimulus transmission device, and the physical stimulus given to the user is influenced. In addition, the input device itself moves, and hence a problem arises in that noise is generated in the stimulus for giving a haptic feel to the user, and a haptic effect is not necessarily produced constantly. To cope with this, in the stimulus transmission device, the pressure receiving portion 5 which can move without moving in conjunction with the device body may be intentionally provided in the portion which is not the portion of the input device.

In the stimulus transmission device, the pressure receiving portion 5 may be present not in the portion of the input device but in a portion other than a portion where pressure is maximized in a state in which the user holds the stimulus transmission device without manipulating the stimulus transmission device. For example, in the game controller, a portion against which a controller body is pressed firmly with the back of a hand is present in addition to the input device such as the stick. When the pressure receiving portion 5 is provided in such a portion, large force is applied to the actuator which drives the pressure receiving portion 5, and power consumption for driving the actuator is increased. To cope with this, in the stimulus transmission device, the pressure receiving portion 5 is positioned in the portion other than the portion where pressure is maximized in the state in which the user holds the stimulus transmission device without manipulating the stimulus transmission device. Specific examples thereof include the stimulus transmission device in which the pressure receiving portion 5 is provided at a position where one or both of the third finger and the middle finger are in contact with the device body, and the stimulus transmission device in which the pressure receiving portion 5 is provided at a position where one or both of the root of the third finger and the root of the middle finger are in contact with the device body.

In the stimulus transmission device, the pressure receiving portion 5 may be present not in the portion of the input device but in the portion where pressure is maximized in the state in which the user holds the stimulus transmission device without manipulating the stimulus transmission device. The portion where pressure is maximized in the state in which the user holds the stimulus transmission device without manipulating the stimulus transmission device is usually a portion where the palm of a hand is in contact with the device body. Certain pressure applied to the pressure receiving portion 5 facilitates the transmission of the physical stimulus to the user. Accordingly, the pressure receiving portion 5 may be provided in the portion where pressure is maximized in the state in which the user holds the stimulus transmission device without manipulating the stimulus transmission device. This mode is preferable in the stimulus transmission device having a pressure sensor for measuring pressure applied to the pressure receiving portion 5 by the user. The value of the pressure applied by the user which is measured by the pressure sensor is stored in a storage part of the device. Subsequently, for example, the device reads the pressure values during a predetermined time period, causes an operation part to determine the average of the pressure values, and stores the average in the storage part. In addition, for example, the device may measure the value of pressure generated in response to a game or the like (the value of pressure generated in response to, e.g., action timing or each of scenes of the game such as a scene in which a collision occurs and a scene in which a fish is caught) with a sensor, and may store the value of pressure generated in response to the game or the like. These pressure values are stored as correction values of information on drive applied from the actuator. Subsequently, the device may read the determined average, cause the operation part to perform an operation for correcting the drive signal of the actuator, and drive the actuator after storing the corrected drive signal in the storage part. In addition, the device may receive progress information related to the game or the like, read the correction value of the pressure corresponding to the scene from the storage part by using the progress information, cause the operation part to perform an operation for correcting the drive information of the actuator, and drive the actuator by using the drive signal after the correction.

In the stimulus transmission device, the pressure receiving portion 5 may be present in the input device. In the case where the input device is a stick of a controller, the controller itself serves as the pressure receiving portion. The controller is driven by the actuator, and the physical stimulus is transmitted to the user through the stick.

The actuator 7 is an element for driving the pressure receiving portion 5. The actuator 7 may perform any of or two or more of a movement in a front and rear direction, a movement in a left and right direction, a revolution movement, a rotation movement, and a movement in an up and down direction with respect to the supporting portion 9. The actuator may be integrated with the pressure receiving portion 5 and has a suspension structure (see FIGS. 71 to 73 in Patent Publication JP-A-2017-73101). Between the actuator 7 and a side wall, an elastic member or a shock absorber such as a gel, rubber, or a spring may be present. The actuator preferably has a sensor. Examples of the actuator and its control are described in paragraphs [0033] to [0127] in Patent Publication JP-A-2017-73101. The actuator may be fixed to the pressure receiving portion 5. In addition, the actuator may be connected to the pressure receiving portion 5 and the supporting portion 9 as long as the actuator does not move in conjunction with the device body.

In addition, a mode may be adopted in which a low friction body such as a bearing (ball bearing) or a rail is provided between the actuator 7 and the supporting portion 9, and the actuator slides on the low friction body.

The supporting portion 9 is an element which is not displaced integrally with the actuator 7 (does not move in conjunction with the actuator 7) even when the actuator 7 is displaced, and supports the actuator 7 in a state in which the actuator 7 is movable. The supporting portion 9 is usually integrated with the device body (housing). The actuator 7 does not move in conjunction with the supporting portion 9, and hence it is possible to efficiently transmit the vibration of the actuator 7 to the user via the pressure receiving portion 5. That the actuator 7 does not move in conjunction with the supporting portion 9 may mean not only that no displacement occurs in the supporting portion due to the displacement of the actuator, but also that, when the actuator is driven, the supporting portion and the device body vibrate slightly (e.g., $\frac{1}{10}$ or less or $\frac{1}{50}$ or less of the amplitude of the actuator) as compared with the vibration of the actuator. The supporting portion is usually present below the actuator. On the other hand, in the case where the actuator is suspended, the supporting portion may be a portion which supports coupling means such as a string used to suspend the actuator.

In the stimulus transmission device, the pressure receiving portion 5 may perform the same displacement in response to applied force in a tangential direction in a movable portion of the pressure receiving portion 5. That is, even in the case where the pressure receiving portion 5 moves with respect to the device (particularly in the case where the pressure receiving portion 5 is displaced so as to pivot in an arc about a certain point), when the same force is applied in the tangential direction at a point of application of the force, an angle and a magnitude (displacement) of displacement with respect to the direction of a perpendicular from the point of application of the force are not changed. Note that the displacement may not be the same displacement.

The stimulus transmission device may have a shaft part having a gimbal structure which is provided below the actuator 7, and a bearing which is provided in the supporting portion 9 and receives the shaft part having the gimbal structure. The shaft part having the gimbal structure has a main shaft which extends vertically downward from the actuator 7, and two shafts which are present in the lower part of the main shaft and extend in an x-axis direction and a y-axis direction from a point on a z-axis in the case where the main shaft corresponds to the z-axis. The bearing present in the supporting portion 9 rotatably supports the two shafts which extend in the x-axis direction and the y-axis direction. In the example in FIG. 1, a surface on the z-axis which is in contact with the supporting portion 9 is curved. The stimulus transmission device may have the elastic member 21 which is provided below or horizontally to the actuator, and connects the supporting portion and the actuator. In the example in FIG. 1, the elastic member is a spring provided below the actuator. The stimulus transmission device may have a support shaft which is provided below the actuator, supports the actuator, and has a lower part in contact with the bearing present in the supporting portion, and the lower part of the support shaft may have a curved surface portion in a portion in contact with the bearing. Note that the curved surface portion may be any curved surface portion as long as the curved surface portion is determined to be a curved surface from a macroscopic viewpoint, and includes a curved surface portion in the case where the portion of the lower part of the support shaft which is in contact with the bearing is constituted by a polyhedron including a large number of small flat surfaces.

In the stimulus transmission device, the pressure receiving portion 5 and the actuator 7 may move integrally with each other, and an angle of the pressure receiving portion 5 with respect to the supporting portion 9 may change. For example, the stimulus transmission device shown in FIG. 1 moves so as to pivot in an arc about a point of contact between the lower part of the shaft in the z-axis direction present below the actuator 7 and the supporting portion 9. Accordingly, in the device, the pressure receiving portion 5 and the actuator 7 move integrally with each other, and the angle of the pressure receiving portion 5 with respect to the supporting portion 9 changes.

Figure 2:
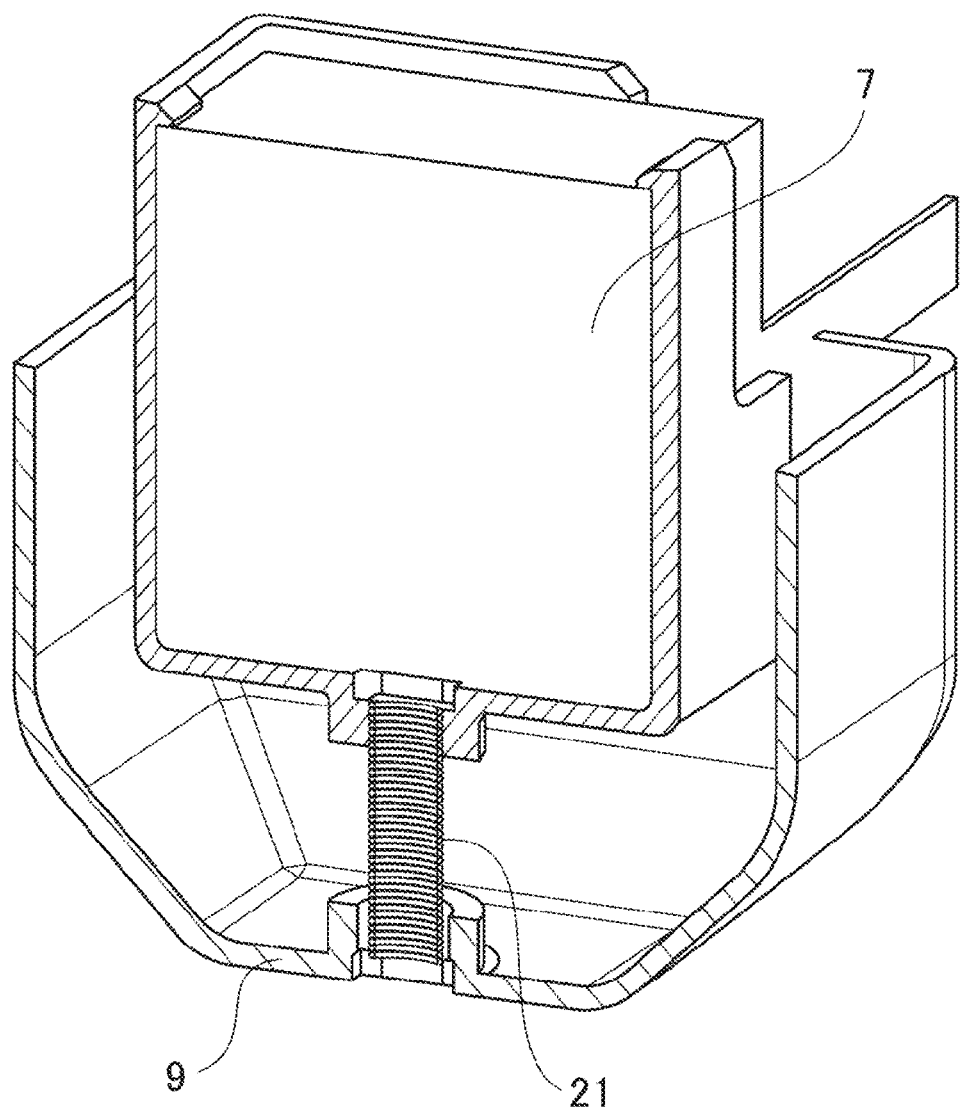
FIG. 2 is a conceptual view (cross-sectional view) showing an example of the stimulus transmission device.

FIG. 2 is a conceptual view (cross-sectional view) showing an example of the stimulus transmission device. In this example, an elastic member (spring) serving as a shaft extends from the lower part of the actuator 7, the lower part of the shaft is connected to the supporting portion 9 and, in the case where the pressure receiving portion 5 is displaced, the angle of the pressure receiving portion 5 with respect to the supporting portion 9 changes with deformation of the elastic member. Subsequently, the pressure receiving portion 5 (and the shaft below the actuator) is corrected so as to be vertically oriented by the elastic member.

In this example, the entire spring can bend.

Figure 3:
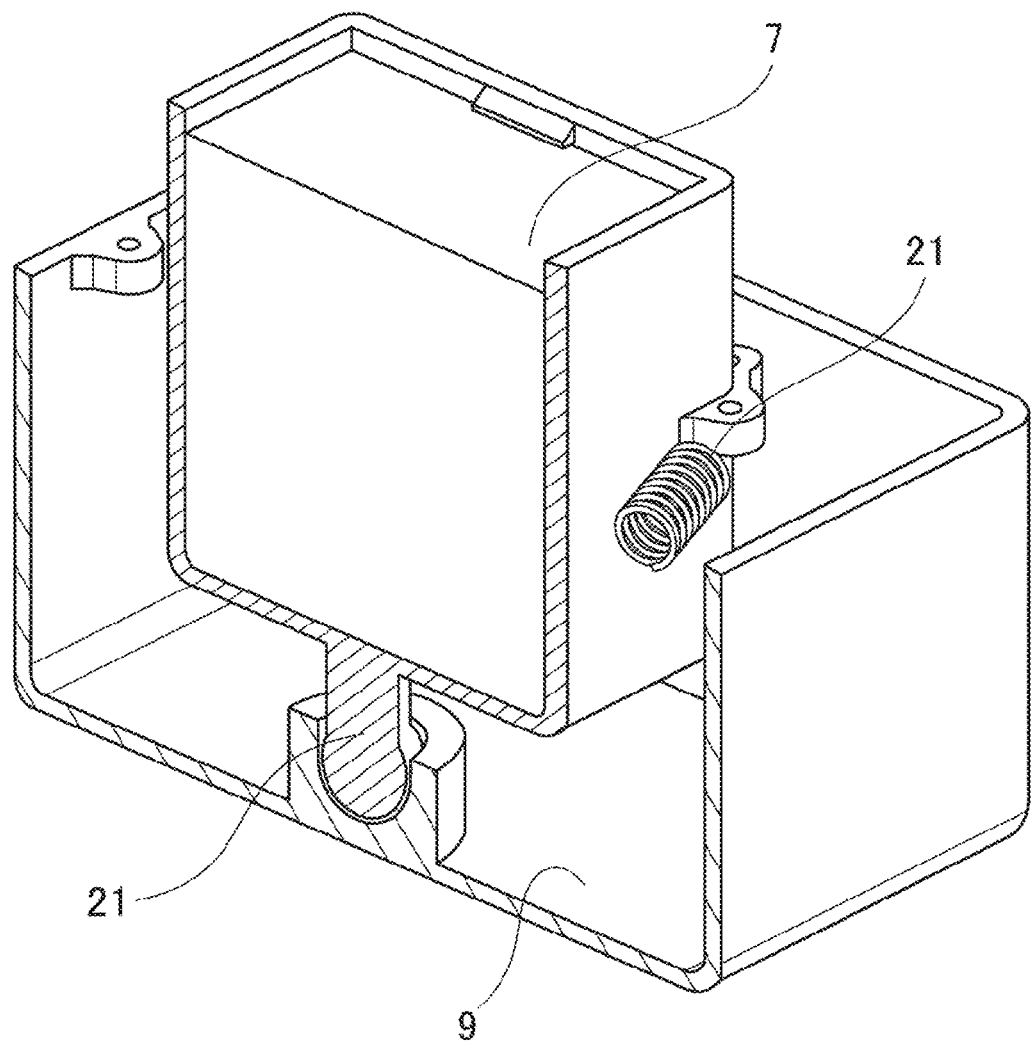
FIG. 3 is a conceptual view (cross-sectional view) showing an example of the stimulus transmission device.

FIG. 3 is a conceptual view (cross-sectional view) showing an example of the stimulus transmission device. In this example, the stimulus transmission device has a shaft which extends vertically downward from the lower part of the actuator 7. A bearing present in the supporting portion 9 supports the shaft such that the pressure receiving portion 5 can be displaced (angled) in the x-axis direction and the y-axis direction in the case where the shaft corresponds to the z-axis. An elastic member (spring) which extends from the side of the actuator 7 is connected to the supporting portion 9, and the pressure receiving portion 5 (and the shaft below the actuator) is corrected so as to be vertically oriented by deformation of the elastic member. In the example in FIG. 3, a surface on the z-axis which is in contact with the supporting portion 9 is curved.

In the example in FIG. 3, the pivotal center is present below the container of the actuator, and the pressure receiving portion returns to a predetermined position even when the pressure receiving portion is displaced with the spring present on the side of the container of the actuator.

Figure 4:
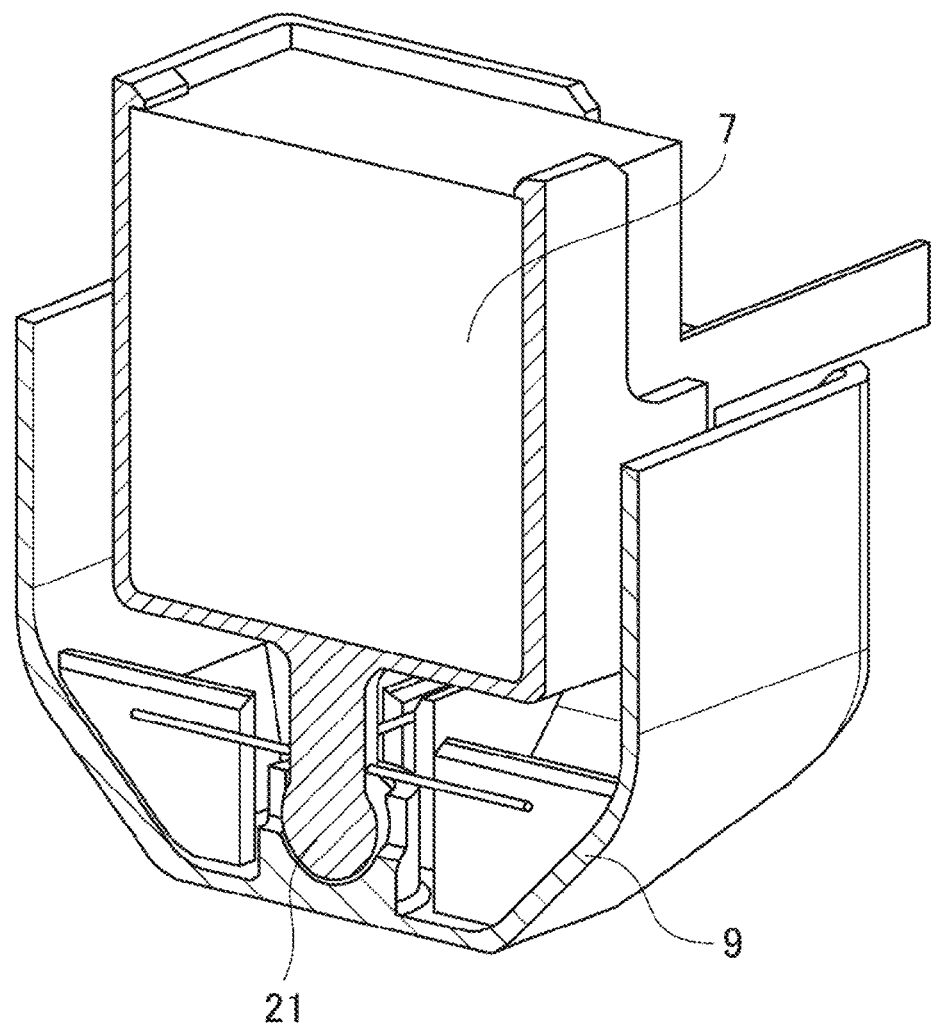
FIG. 4 is a conceptual view (cross-sectional view) showing an example of the stimulus transmission device.

FIG. 4 is a conceptual view (cross-sectional view) showing an example of the stimulus transmission device. This device has a main shaft which extends vertically downward from the actuator 7, and two shafts serving as elastic members which are present on the main shaft and extend in the x-axis direction and the y-axis direction from a point on the z-axis in the case where the main shaft corresponds to the z-axis. A bearing present in the supporting portion 9 includes a bearing which allows the pressure receiving portion 5 to be displaced (angled) in the x-axis direction and the y-axis direction, and a bearing which supports the two shafts extending in the x-axis direction and the y-axis direction such that the two shafts can be displaced. In the case where the pressure receiving portion 5 is displaced, the pressure receiving portion 5 (and the shaft below the actuator) is corrected so as to be vertically oriented by deformation of the shafts in the x-axis direction and the y-axis direction which serve as the elastic members. In the example in FIG. 4, the stimulus transmission device has walls holding the x-axis therebetween which have space in which the x-axis moves in the up and down direction, and walls holding the x-axis therebetween which have space in which the x-axis moves in the up and down direction. In the example in FIG. 4, a surface on the z-axis which is in contact with the supporting portion 9 is curved.

Figure 5:
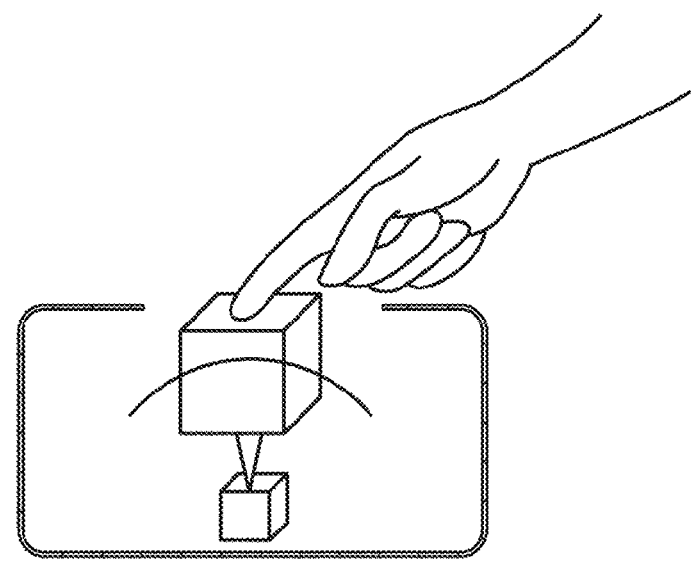
FIG. 5 is a conceptual view for explaining a rotary bearing floating structure.

FIG. 5 is a conceptual view for explaining a rotary bearing floating structure. The stimulus transmission device in each of FIGS. 1 to 4 can be said to be the stimulus transmission device having the rotary bearing floating structure basically. As shown in FIG. 5, in the stimulus transmission device having the rotary bearing floating structure, the pressure receiving portion (and the actuator) which does not move in conjunction with the device body is present. The structure in which the operation of the device body is not synchronized with the operation of the pressure receiving portion in this manner is the floating structure. In the rotary bearing floating structure, for example, the pressure receiving portion (i.e., a portion which transmits the stimulus to the user) is displaced so as to pivot in an arc about a contact portion between the shaft extending below the actuator and the supporting portion (a contact portion with the bearing present in the supporting portion).

In the case where the pressure receiving portion has moved to a certain position, the pressure receiving portion is preferably configured to return to the original position or a predetermined position. For example, the pressure receiving portion preferably has the function of automatically returning when pressure of contact of part of a body which is in contact with the pressure receiving portion is reduced, or the part of the body is moved off the pressure receiving portion. With this, origin search to the original position or the predetermined position is automatically performed, the user does not need to perform the origin search, and operability is improved. In addition, by performing control such that the origin search to any position is performed, it is possible to control and enhance the level of the physical stimulus to the user.

Figure 6:
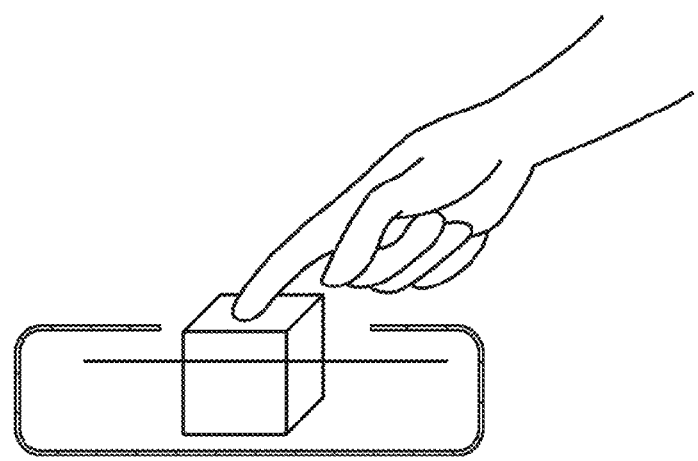
FIG. 6 is a conceptual view for explaining a parallel floating structure.

FIG. 6 is a conceptual view for explaining a parallel floating structure. In the stimulus transmission device having the parallel floating structure, in the case where the pressure receiving portion 5 is displaced, a flat surface having the upper surface of the pressure receiving portion 5 is maintained substantially parallel. In an example of the parallel floating structure, the pressure receiving portion 5 is two-dimensionally displaced in the front and rear direction and the left and right direction. In addition, in another example of the parallel floating structure, it can be said that, in the case where the pressure receiving portion 5 is displaced, the flat surface having the upper surface of the pressure receiving portion 5 before the displacement is substantially parallel to the flat surface having the upper surface thereof after the displacement. That is, in the stimulus transmission device, the pressure receiving portion 5 and the actuator 7 may move integrally with each other, and the pressure receiving portion 5 may move while being maintained parallel to the supporting portion 9. The stimulus transmission device having the parallel floating structure may have a structure described below in addition to the gimbal structure shown in FIG. 1. In addition, the stimulus transmission device having the parallel floating structure may have a structure in which a rail is laid on the supporting portion and the actuator moves on the rail.

Figure 30:
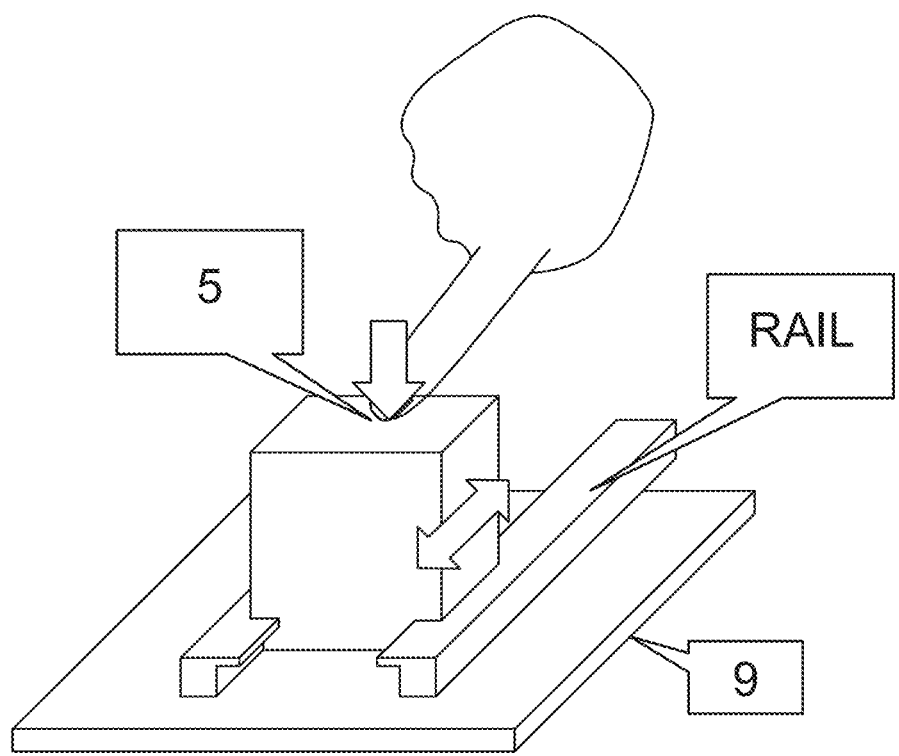
FIG. 30 is a conceptual view showing an example in which the supporting portion supports the pressure receiving portion via rails.
Figure 31:
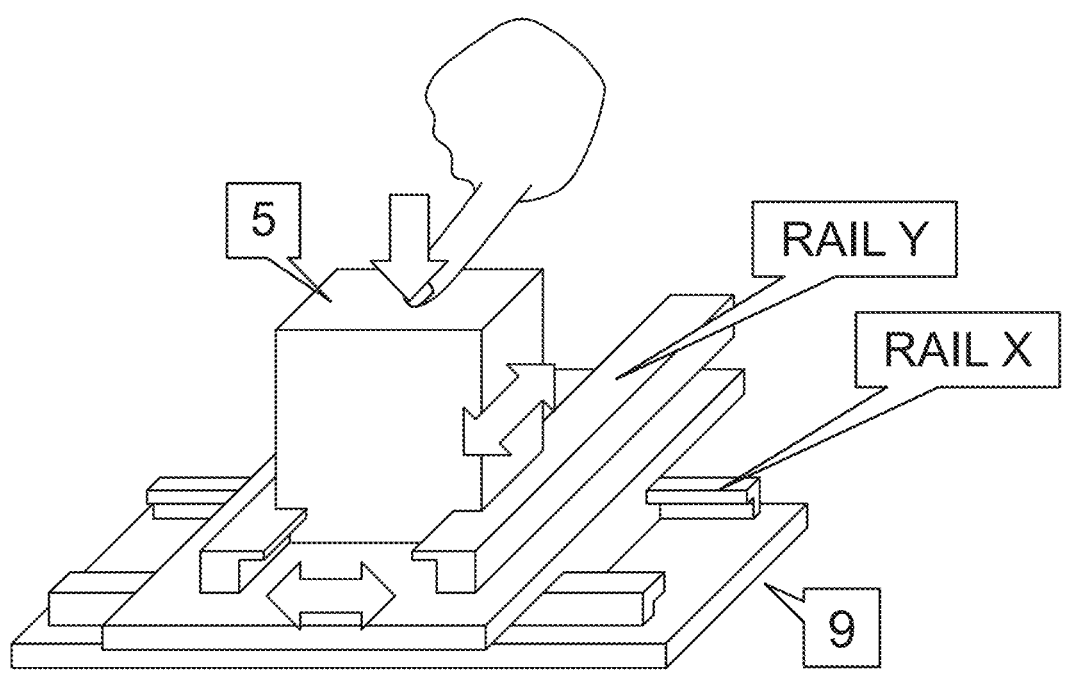
FIG. 31 is a conceptual view showing an example in which the supporting portion supports the pressure receiving portion via rails in an X-axis direction and rails in a Y-axis direction.

A connection portion may be a low friction body such as the rail. The low friction body is an element which can reduce friction. FIG. 30 is a conceptual view showing an example in which the supporting portion supports the pressure receiving portion via the rails. FIG. 31 is a conceptual view showing an example in which the supporting portion supports the pressure receiving portion via rails in an X-axis direction and rails in a Y-axis direction. In the example in FIG. 31, it is possible to move the pressure receiving portion two-dimensionally. The supporting portion is not limited to the examples in FIGS. 30 and 31, and the supporting portion may support the pressure receiving portion such that the pressure receiving portion can move in a multidimensional direction by using a plurality of the rails. The rail may be linear or curved.

Figure 7:
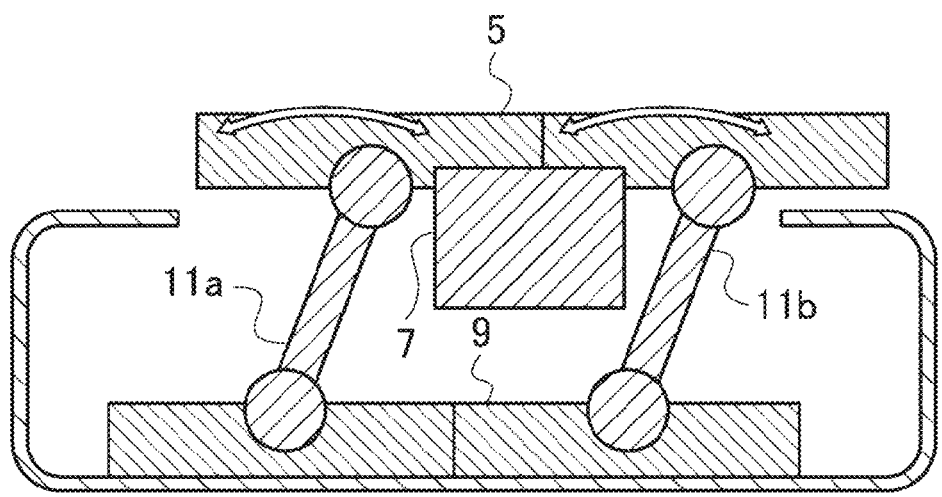
FIG. 7 is a conceptual view showing an example of the stimulus transmission device having the parallel floating structure.

FIG. 7 is a conceptual view showing an example of the stimulus transmission device having the parallel floating structure. In this example, the stimulus transmission device may have at least two or more coupling means 11a and 11b (links) which connect the pressure receiving portion 5 or the actuator 7, and the supporting portion 9. In the example in FIG. 7, the coupling means 11a and 11b have shafts which are pivotally connected to the pressure receiving portion 5 in the upper parts of the shafts, and are pivotally connected to the supporting portion 9 in the lower parts of the shafts. In this example, four shafts including coupling means which are not shown are present, and the pressure receiving portion 5 is displaced so as to pivot in an arc when attention is focused on a given point on the upper surface of the pressure receiving portion 5 while the upper surface of the pressure receiving portion 5 is maintained parallel to a given flat surface of the supporting portion. Note that being maintained parallel not only means being maintained parallel in a strict sense but also includes the case where the pressure receiving portion is displaced while being maintained substantially parallel as compared with the pressure receiving portion which is displaced so as to pivot in an arc.

In the example in FIG. 7, there are four shafts. On the other hand, the number of shafts may be one, may be two or three, and may also be five or more (N).

In the example in FIG. 7, the coupling means 11a and 11b have the shafts and pivots (axles) for rotationally moving the shafts. In each of the coupling means 11a and 11b, the structure of each of a portion which connects the pressure receiving portion 5 or the actuator 7 and the coupling means and a portion which connects the supporting portion 9 and the coupling means may be a free joint or a cross-axis joint. Each of the coupling means 11a and 11b may be an elastic member such as a string, rubber, a spring, or a gel (viscoelastic member). The elastic member may have the function of returning the pressure receiving portion 5 to the original state when the pressure receiving portion 5 is displaced.

The above-described low friction body may be used instead of the elastic member. In the example in FIG. 7, the actuator may vibrate in a left and right direction and a depth direction in the drawing. In addition, each of the coupling means 11a and 11b may be connected to the pressure receiving portion 5 or the supporting portion 9 by a free joint such as a ball link. Further, each of the coupling means 11a and 11b may also be connected to the pressure receiving portion or the supporting portion with the gimbal structure.

Figure 8A:
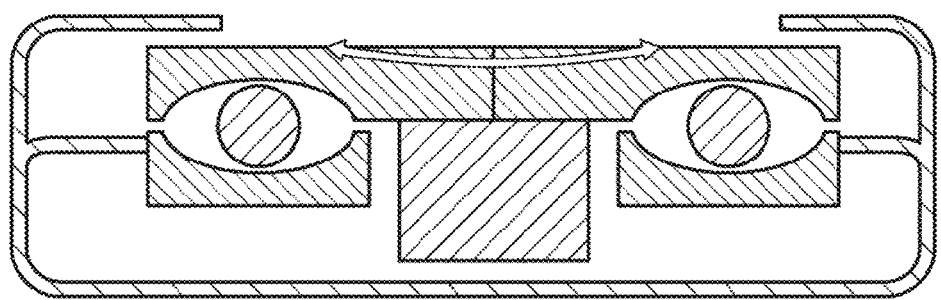
FIG. 8A is a conceptual view showing an example of the stimulus transmission device having the parallel floating structure.
Figure 8B:
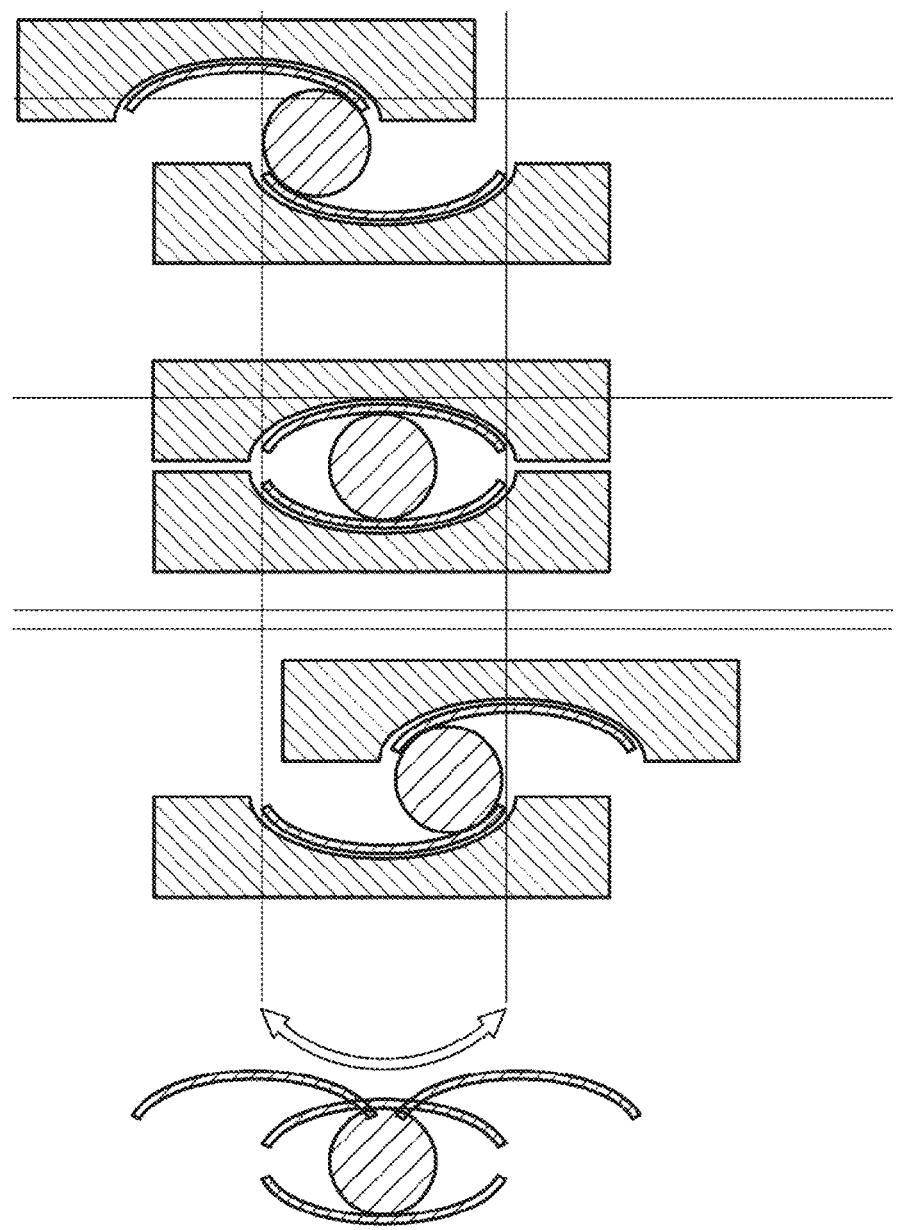
FIG. 8B is a conceptual view for explaining a ball bearing.

FIG. 8A is a conceptual view showing an example of the stimulus transmission device having the parallel floating structure. As shown in FIG. 8A, the stimulus transmission device may have a ball bearing which connects the pressure receiving portion or the actuator, and the supporting portion 9. In the stimulus transmission device, a smooth depression (upper depression) is present in the lower part of the pressure receiving portion 5 or the actuator 7. FIG. 8B is a conceptual view for explaining the ball bearing. The smooth depression may have any shape such as a triangle or a free curve in addition to an arc. In addition, the smooth depression may have a one-dimensional shape, a two-dimensional shape, or a three-dimensional shape. The shape of a shell in which a ball is accommodated may be able to be deformed and controlled by using a shape-memory alloy or an actuator including a piezoelectric element array. The shape of a sphere (roller) may be designed so as to meet a desired guidance path of a finger. By designing the shape thereof in this manner, it is possible to change the movement of the finger, feeling, operational feeling, and operability. In addition, by adjusting the sphere (roller) and the surface roughness of the sphere, a depression pattern, and the shape of a groove in the surface, it is possible to freely change feeling, operational feeling, and operability. The upper depression may be a groove. On the other hand, in the supporting portion 9, a depression (lower depression) is present at a position corresponding to the upper depression, and the upper depression and the lower depression are combined with each other to form space in which the sphere can rotate.

Each of the upper depression and the lower depression may have oval space or space in the shape of a rugby ball in the case where the device is viewed from the side (the case in FIGS. 8A and 8B). The upper depression and the lower depression may be provided so as to form a circle when viewed from the upper part of the device. In addition, when the upper depression and the lower depression are viewed from the upper part of the device, upper depressions and lower depressions may be provided at two positions in the north and the south (or the west and the east), upper depressions and lower depressions may be provided at four symmetrical positions, upper depressions and lower depressions may be provided at eight symmetrical positions, or upper depressions and lower depressions may be provided at twelve symmetrical positions. The movement of a flat plate having the depression matches the movement of the finger.

Figure 9A:
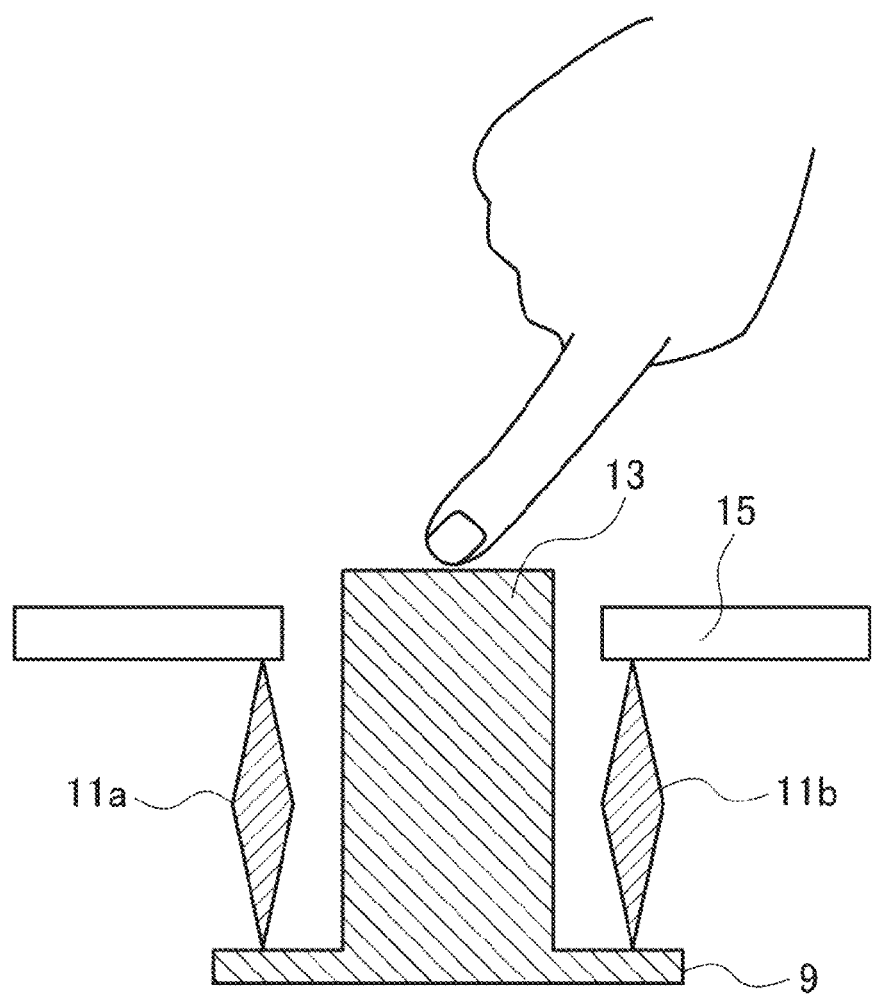
FIG. 9A is a conceptual view showing the stimulus transmission device having a movement control mechanism.
Figure 9B:
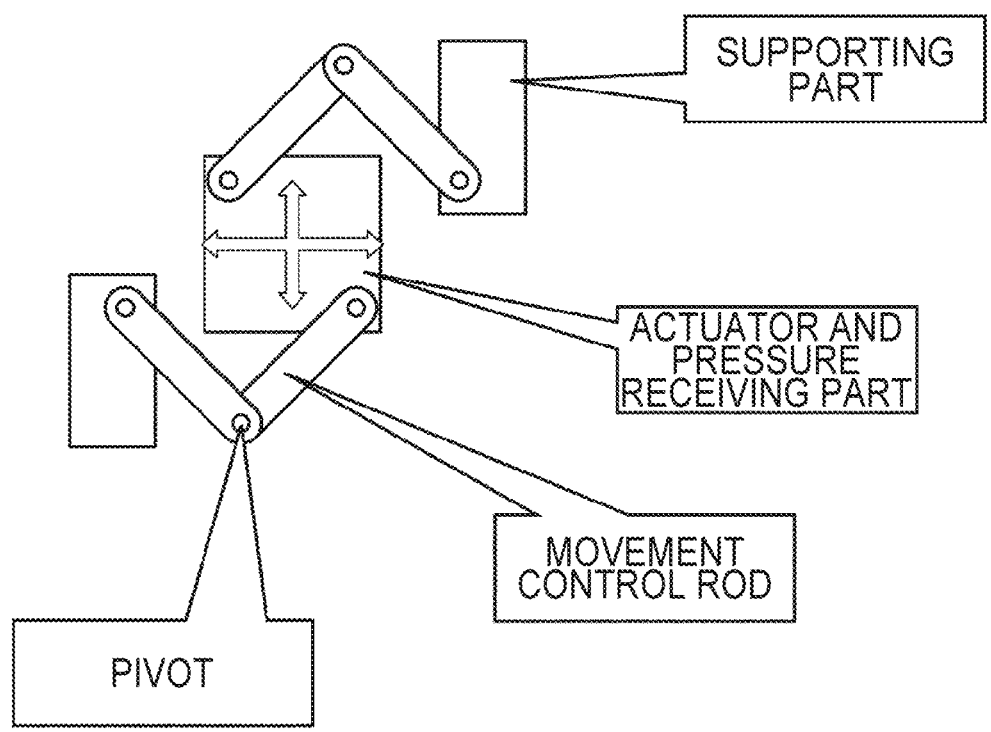
FIG. 9B is a conceptual view showing the stimulus transmission device having the movement control mechanism.

The stimulus transmission device may have a movement control rod 13 which is provided in a portion of the actuator 7 which faces the supporting portion 9, and a movement control frame 15 which is provided in the supporting portion 9 and controls the movement of the movement control rod 13. As shown in FIG. 9A, the stimulus transmission device may have the movement control rod 13 which stands upright from the supporting portion 9 in a direction of the pressure receiving portion 5, and the movement control frame 15 which controls the movement of the movement control rod 13. In addition, as shown in FIG. 9B, the stimulus transmission device may allow the movement control rod to protrude from the side surface of the actuator or the pressure receiving portion.

Figure 18:
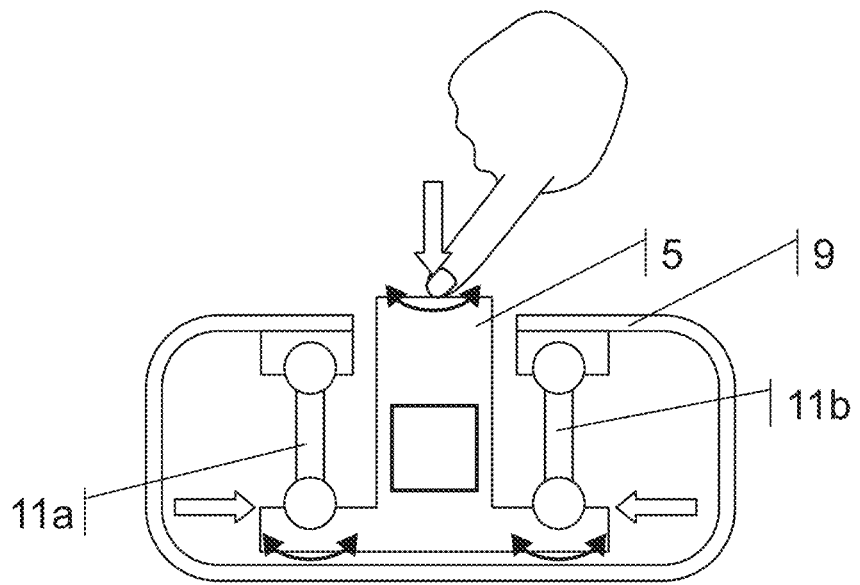
FIG. 18 is a conceptual view showing a mode in which the supporting portion which is part of a housing supports the actuator and the pressure receiving portion in a state in which the actuator and the pressure receiving portion are suspended via coupling means.

FIG. 18 is a conceptual view showing a mode in which the supporting portion 9 which is part of the housing supports the actuator and the pressure receiving portion which are suspended via the coupling means 11a and 11b. Each of the coupling means 11a and 11b may be connected to the pressure receiving portion 5 or the supporting portion 9 with the free joint such as the ball link. In addition, each of the coupling means 11a and 11b may be connected to the pressure receiving portion or the supporting portion with the gimbal structure.

FIG. 9A is a conceptual view showing the stimulus transmission device having a movement control mechanism. The movement control frame 15 is adjusted to a height at which the movement control rod 13 moves inside the frame.

It is possible to use any shape and any material for the frame of the movement control frame 15. With this, it is possible to arbitrarily control physical quantities such as positions, speed, acceleration, force, stress, shearing force, resistance, friction, viscosity, elasticity, vibration, rising speed or acceleration, and power of the movement control frame 15 and/or the movement control rod 13, and changes of the physical quantities, whereby it is possible to design characteristics of low friction and stimulus transmission easily, properly, and effectively. The shape of the movement control frame 15 may be rectangular, circular, oval, or rugby ball-shaped, and may change according to a non-linear curve or change dynamically. With this, it is possible to control the physical quantity by using pressure from the user, implement the center return to any position, and control first and second physical quantities and the pressure from the user. In other movement control mechanisms, it is possible to implement the same operations as those described above by properly designing/selecting the shape, strength, and material of the mechanism. Coupling function by the movement control rod 13 may be the mechanism and function of coupling in any of other movement control mechanisms.

Figure 19:
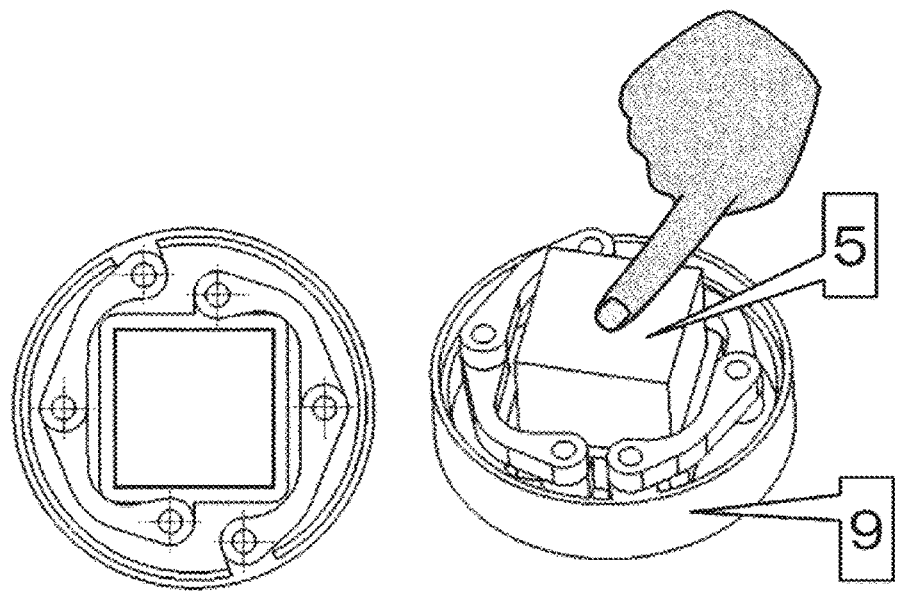
FIG. 19 is a conceptual view showing the implementation system of the stimulus transmission device shown in FIG. 9A.

FIG. 19 is a conceptual view showing the implementation system of the stimulus transmission device shown in FIG. 9A. In this example, the upper part of the cylindrical housing is opened, and the pressure receiving portion is touched from an opening part.

An example of the stimulus transmission device is a game controller. For example, the user plays a game while holding the game controller. A game program is stored in a storage part of a game system. On the other hand, the controller has the stimulus transmission device of the present invention. A sensor included in the actuator of the stimulus transmission device measures various pieces of information including pressing force. The measured pieces of information are stored in the storage part of the game system. On the other hand, the game program includes a control command for driving the actuator in the stimulus transmission device in accordance with the progress of the game. A control part of the game system drives the actuator based on the control command for driving the actuator. As a result, a physical stimulus such as displacement or vibration caused by driving the actuator is transmitted to the pressure receiving portion. The pressure receiving portion is in contact with part of the body of the user, and pressure is applied to the pressure receiving portion from the user. Accordingly, the physical stimulus transmitted to the pressure receiving portion is transmitted to the user. In the case where the control command of the actuator is based on the haptic feel (haptics), the user receives feeling based on the haptic feel.

Figure 15:
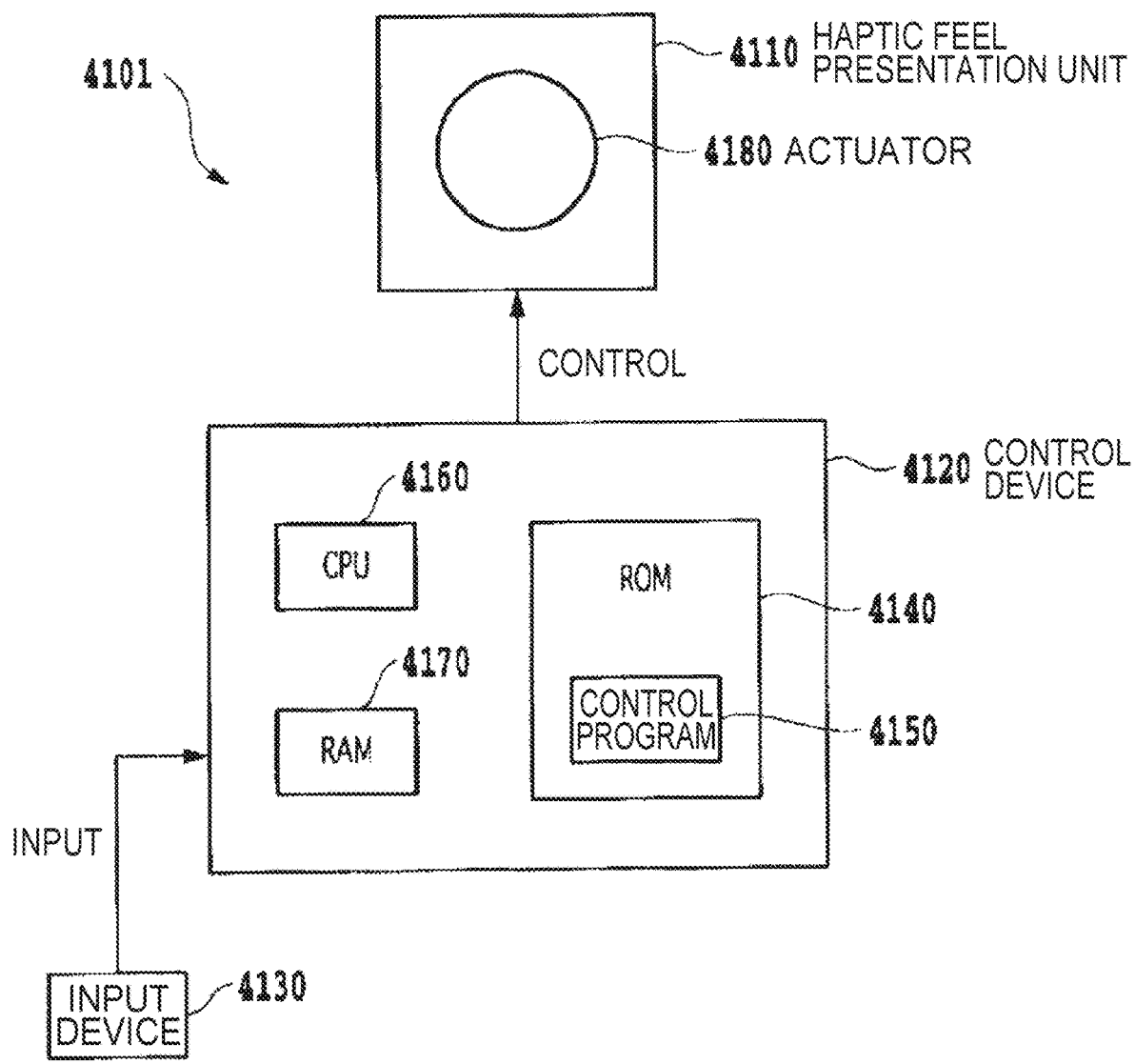
FIG. 15 is a block diagram of a haptic information presentation system.

FIG. 15 is an example of a block diagram of a haptic information presentation system. In FIG. 15, a haptic information presentation system 4101 is constituted by a haptic feel presentation unit 4110, a control device 4120, and an input device 4130. The haptic feel presentation unit 4110 has one or more actuators 4180, and operates according to control from the control device 4120. For the drive of the actuators 4180, it is possible to use a stepping motor or a servomotor. The control device 4120 has a CPU (central processing unit) 4160, a RAM (random access memory) 4170, and a ROM (read only memory) 4140.

The CPU 4160 is in charge of the entire operation of the control device 4120. The RAM 4170 is used as a work area in which data to be processed when the CPU 4160 performs processes is temporarily stored. In the ROM 4140, a control program 4150 is pre-stored. The control program 4150 is a program in which control processing of the haptic feel presentation unit 4110 corresponding to an input signal from the input device 4130 is specified. The CPU 4160 reads the control program 4150 from the ROM 4140 and executes the control program 4150 to control the actuators 4180 of the haptic feel presentation unit 4110 correspondingly to each input signal.

The input device 4130 is, e.g., a selection button of an input menu or the like. The CPU 4160 performs a process corresponding to the input of the selection button selected by pressing or touching. Such an input device 4130 may be integrated with the control device 4120 to be part of the control device 4120.

Alternatively, the input device 4130 is a device such as a known myoelectric detector for detecting myoelectric potential or a known angular acceleration sensor. When a trigger signal indicative of a myoelectric potential occurrence from the myoelectric detector or a signal indicative of angular acceleration from the angular acceleration sensor is input to the control device 4120, the CPU 4160 performs control of the haptic feel presentation unit 4110 having feedback on the input. The input device 4130 such as the angular acceleration sensor may be configured to be included inside the haptic feel presentation unit 4110 together with the haptic feel presentation unit 4110.

A common processing method in which the CPU 4160 reads the control program 4150 from the ROM 4140 and executes the control program 4150, and the actuators 4180 of the haptic feel presentation unit 4110 are thereby controlled correspondingly to each input signal is known to those skilled in the art.

EXAMPLES

Figure 10A:
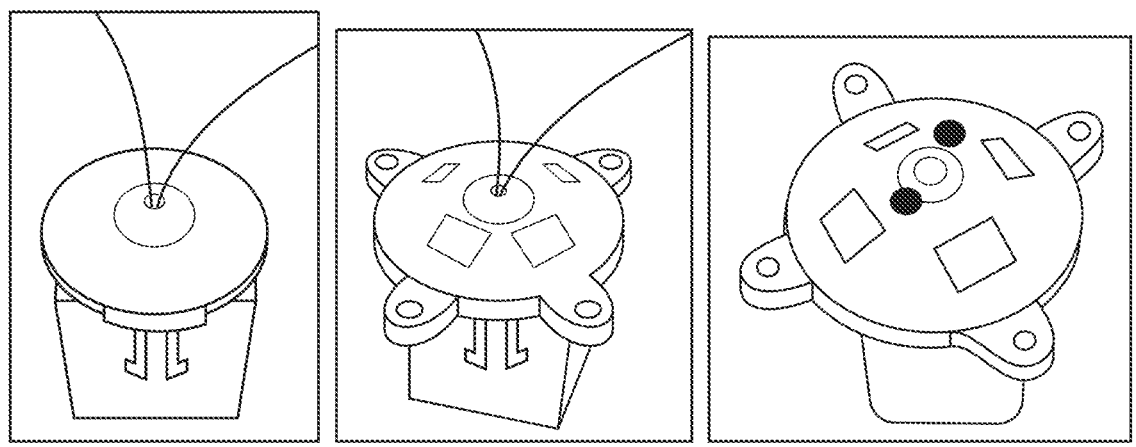
FIG. 10A includes photographs which are substituted for drawings showing a supporting portion manufactured in Example.

FIG. 10A includes photographs which are substituted for drawings showing the supporting portion manufactured in Example. In this example, two wires for fixing the actuator from the center of the supporting portion and restoring the actuator in the case where the actuator is displaced are present. The wires are fixed with screws. The lower part of the actuator has a curved surface, and the curved surface is in contact with the supporting portion vie an elastic member (rubber). A structure is adopted in which tension of the wire can be adjusted by using deformation of the elastic member and fastening force of the screw. With this structure, the actuator is displaced so as to pivot in an arc about a wire hole of the supporting portion while being present at the center of the supporting portion.

Figure 10B:
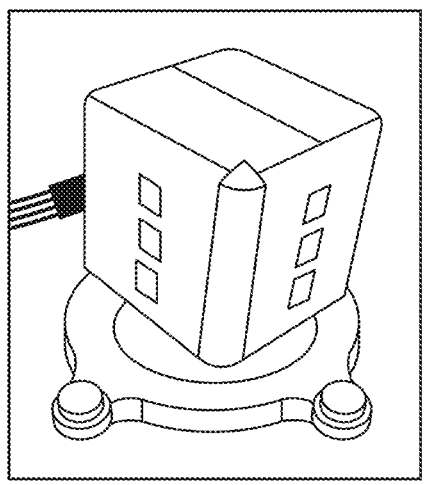
FIG. 10B includes photographs which are substituted for drawings showing an example in which an actuator is mounted to the supporting portion manufactured in Example.
Figure 10B:
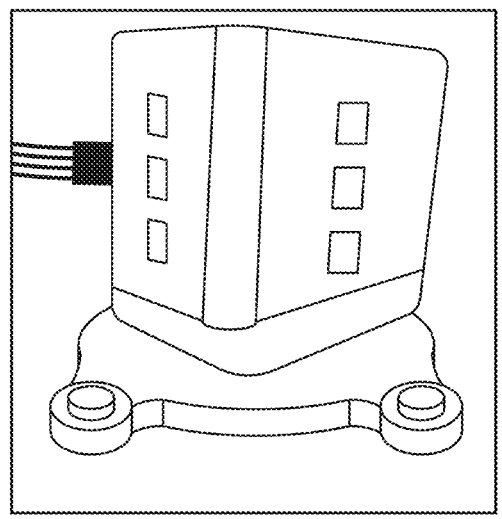

FIG. 10B includes photographs which are substituted for drawings showing an example in which the actuator is mounted to the supporting portion manufactured in Example. In this example, the actuator is connected to the supporting portion via the lower part and the sides of the actuator and an elastic member (gel). The pressure receiving portion can be displaced in the x-axis direction, the y-axis direction, and the z-axis direction, and the pressure receiving portion can be present at the center of the supporting portion with the deformation of the elastic member.

Figure 11:
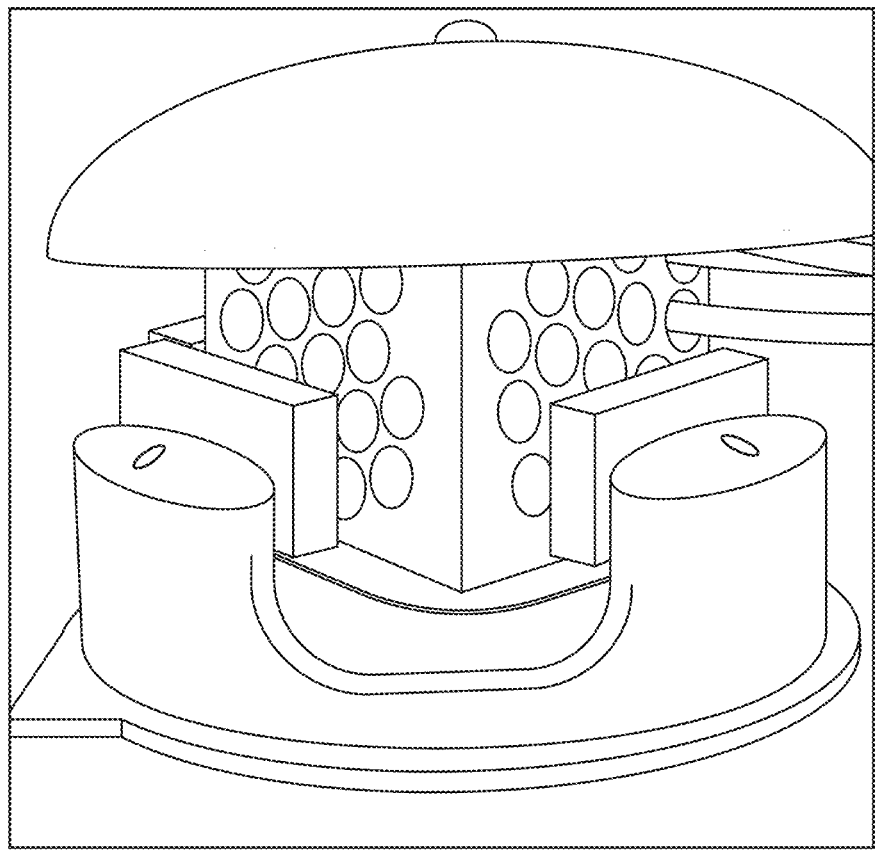
FIG. 11 is a photograph which is substituted for a drawing showing the stimulus transmission device (a portion other than a device body) in which gels (cushioning material) are provided on four surfaces of the actuator, and a pressure receiving portion, the actuator, and the supporting portion are surrounded by foamed resin.

FIG. 11 is a photograph which is substituted for a drawing showing the stimulus transmission device (a portion other than the device body) in which gels (cushioning material) are provided on four surfaces of the actuator, and the pressure receiving portion, the actuator, and the supporting portion are surrounded by foamed resin.

Figure 12:
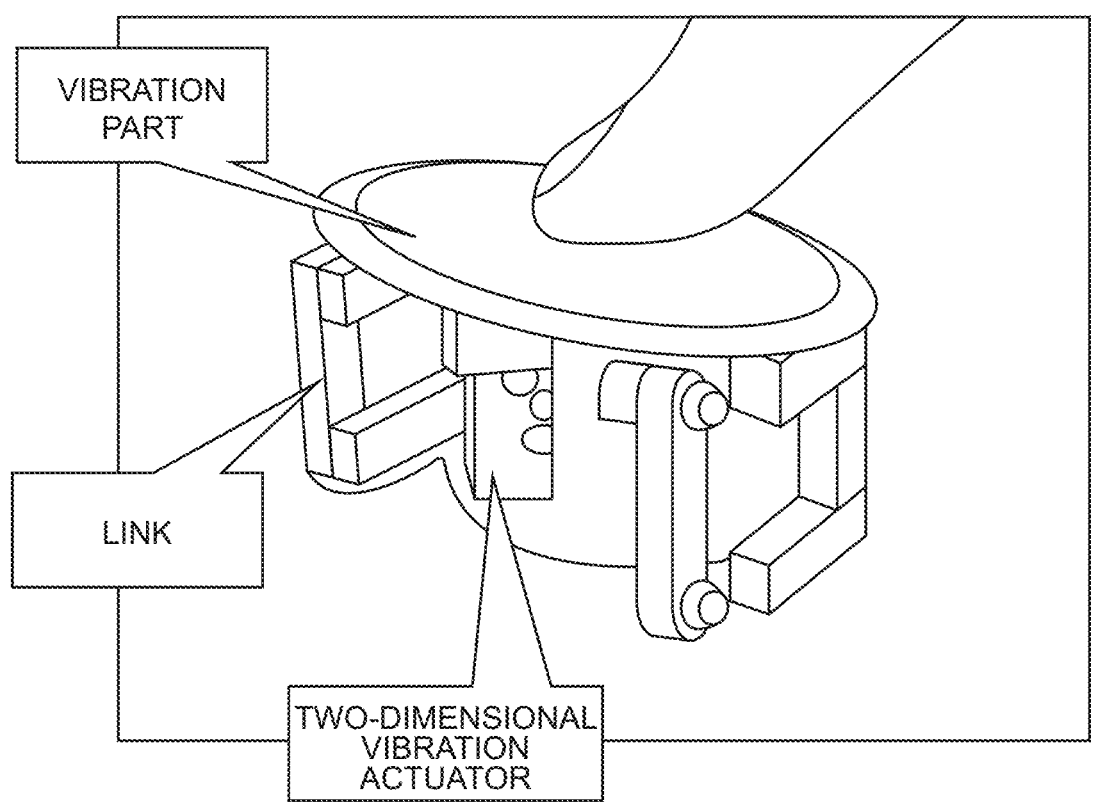
FIG. 12 is a photograph which is substituted for a drawing showing the stimulus transmission device (the portion other than the device body) manufactured in Example.

FIG. 12 is a photograph which is substituted for a drawing showing the stimulus transmission device (the portion other than the device body) manufactured in Example. In this example, a vibration part receives pressure from a portion (contact part) in which a finger and the vibration part (pressure receiving portion) are in contact with each other. The vibration part is fixed to a two-dimensional vibration actuator. The vibration part has a substantially hexagonal shape, and links (coupling means) extend from four corners and are connected to the supporting portion. With this structure, the upper surface of the vibration part is displaced while being maintained parallel to the ground.

Figure 13:
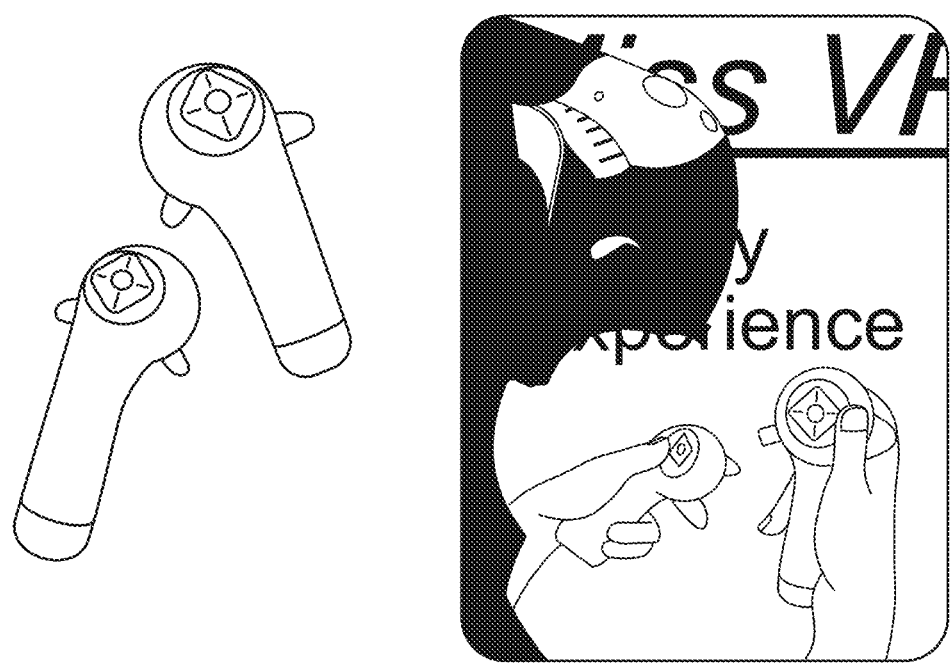
FIG. 13 includes photographs which are substituted for drawings showing the stimulus transmission device manufactured in Example.

FIG. 13 includes photographs which are substituted for drawings showing the stimulus transmission device manufactured in Example. In this example, the actuator is present in a portion of the input device which is manipulated by using the thumb, and the input device constitutes the main portion of the stimulus transmission device. That is, the physical stimulus from the actuator is transmitted to the thumb. Note that, in a controller having a holding portion which is held by the palm of the hand and an input part which is connected to the holding portion and uses the thumb as input means, the controller may be used as the stimulus transmission device by providing the pressure receiving portion and the actuator in the holding portion.

Figure 14:
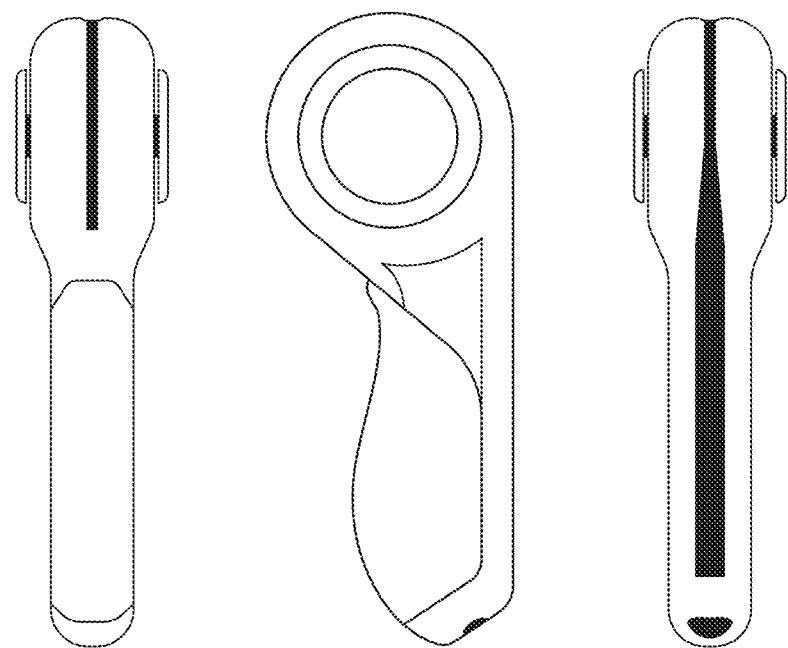
FIG. 14 includes photographs which are substituted for drawings showing the stimulus transmission device manufactured in Example.

FIG. 14 includes photographs which are substituted for drawings showing the stimulus transmission device manufactured in Example. The stimulus transmission device has a holding part, an input device which is present in the upper part of the holding part, and a pressure receiving portion which is present on a surface on a side opposite to the input device. The stimulus transmission device has the parallel floating structure.

The invention can be used in amusement industry, automobile industry, fishing equipment industry, IoT industry, information and communication industry, and medical equipment industry.

REFERENCE SIGNS LIST

5 Pressure receiving portion
7 Actuator
9 Supporting portion

What is claimed is:

1. A stimulus transmission device comprising:
a pressure receiving portion which comes into contact with a contact part which is part of a human body, and receives pressure from the contact part;
an actuator which drives the pressure receiving portion; and
a supporting portion which is part of a housing, and supports the actuator in a state in which the actuator is movable,
wherein the actuator and the supporting portion do not move in conjunction with each other,
wherein the pressure receiving portion and the actuator move integrally with each other,
wherein the pressure receiving portion moves while being maintained parallel to the supporting portion,
the stimulus transmission device further comprising:
a movement control rod which is provided in a portion of the actuator which faces the supporting portion;
a movement control frame which is provided in the supporting portion, and controls movement of the movement control rod in the parallel direction; and
wires for fixing the actuator from the center of the supporting portion so that the actuator is displaced so as to pivot in an arc about a wire hole of the supporting portion while being present at the center of the supporting portion.

2. The stimulus transmission device according to claim 1, further comprising:
a sensor.

3. The stimulus transmission device according to claim 1, further comprising:
one or both of an artificial intelligence part and a machine learning part.

4. The stimulus transmission device according to claim 1, wherein the stimulus transmission device is a haptic information presentation system.

5. The stimulus transmission device according to claim 1, further comprising:
a bearing part which connects the pressure receiving portion or the actuator, and the supporting portion.

6. The stimulus transmission device according to claim 1, wherein the input device is a button.

* * * * *